(12) United States Patent
Hinode et al.

(10) Patent No.: US 10,727,043 B2
(45) Date of Patent: Jul. 28, 2020

(54) SUBSTRATE PROCESSING METHOD AND SUBSTRATE PROCESSING APPARATUS

(71) Applicant: SCREEN Holdings Co., Ltd., Kyoto (JP)

(72) Inventors: Taiki Hinode, Kyoto (JP); Sadamu Fujii, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 162 days.

(21) Appl. No.: 15/910,393

(22) Filed: Mar. 2, 2018

(65) Prior Publication Data

US 2018/0277356 A1 Sep. 27, 2018

(30) Foreign Application Priority Data

Mar. 27, 2017 (JP) ................. 2017-061826

(51) Int. Cl.
*H01L 21/02* (2006.01)
*B08B 3/08* (2006.01)
*B08B 3/10* (2006.01)
*B08B 3/02* (2006.01)
*H01L 21/67* (2006.01)
*H01L 21/687* (2006.01)

(52) U.S. Cl.
CPC ........ *H01L 21/02052* (2013.01); *B08B 3/022* (2013.01); *B08B 3/024* (2013.01); *B08B 3/08* (2013.01); *B08B 3/10* (2013.01); *H01L 21/02057* (2013.01); *H01L 21/67028* (2013.01); *H01L 21/67051* (2013.01); *H01L 21/67109* (2013.01); *H01L 21/68764* (2013.01); *B08B 2203/007* (2013.01)

(58) Field of Classification Search
CPC ......... H01L 21/37034; H01L 21/67028; H01L 21/02052; B08B 3/10; B08B 2203/007
See application file for complete search history.

(56) References Cited

U.S. PATENT DOCUMENTS

| | | | | |
|---|---|---|---|---|
| 5,882,433 A | * | 3/1999 | Ueno ................ | H01L 21/67028 134/31 |
| 2007/0295365 A1 | | 12/2007 | Miya et al. ..................... | 134/26 |
| 2014/0273498 A1 | | 9/2014 | Kobayashi et al. .......... | 438/745 |
| 2015/0243542 A1 | | 8/2015 | Yoshihara et al. | |

(Continued)

FOREIGN PATENT DOCUMENTS

JP 2010-050143 A 3/2010
JP 5139844 B2 2/2013

(Continued)

*Primary Examiner* — Mikhail Kornakov
*Assistant Examiner* — Natasha N Campbell
(74) *Attorney, Agent, or Firm* — Ostrolenk Faber LLP

(57) ABSTRACT

A hole is formed on a liquid film of a low surface tension liquid which covers an entire region of an upper surface of a substrate, and a central portion of the upper surface of the substrate is exposed. The hole in the liquid film of the low surface tension liquid is expanded up to an outer circumference of the substrate. Discharge of hot water is stopped before formation of the hole in the liquid film of the low surface tension liquid. After the liquid film of the low surface tension liquid has been expelled from the upper surface of the substrate, hot water is supplied again to a lower surface of the substrate. A liquid adhering to the substrate is shaken off after stoppage of discharge of the hot water.

9 Claims, 16 Drawing Sheets

(56) References Cited

U.S. PATENT DOCUMENTS

2016/0089685 A1    3/2016  Kimura
2016/0372320 A1    12/2016 Emoto

FOREIGN PATENT DOCUMENTS

| JP | 2014-003323 A | 1/2014 |
|----|---------------|--------|
| JP | 5523502 B2    | 6/2014 |
| JP | 5736017 B2    | 6/2015 |
| JP | 2015-130542 A | 7/2015 |
| JP | 2017-005230 A | 1/2017 |
| TW | 200802581 A   | 1/2008 |
| TW | 201446342 A   | 12/2014 |
| TW | 201546931 A   | 12/2015 |
| TW | 201622835 A   | 7/2016 |
| TW | 201709405 A   | 3/2017 |

\* cited by examiner

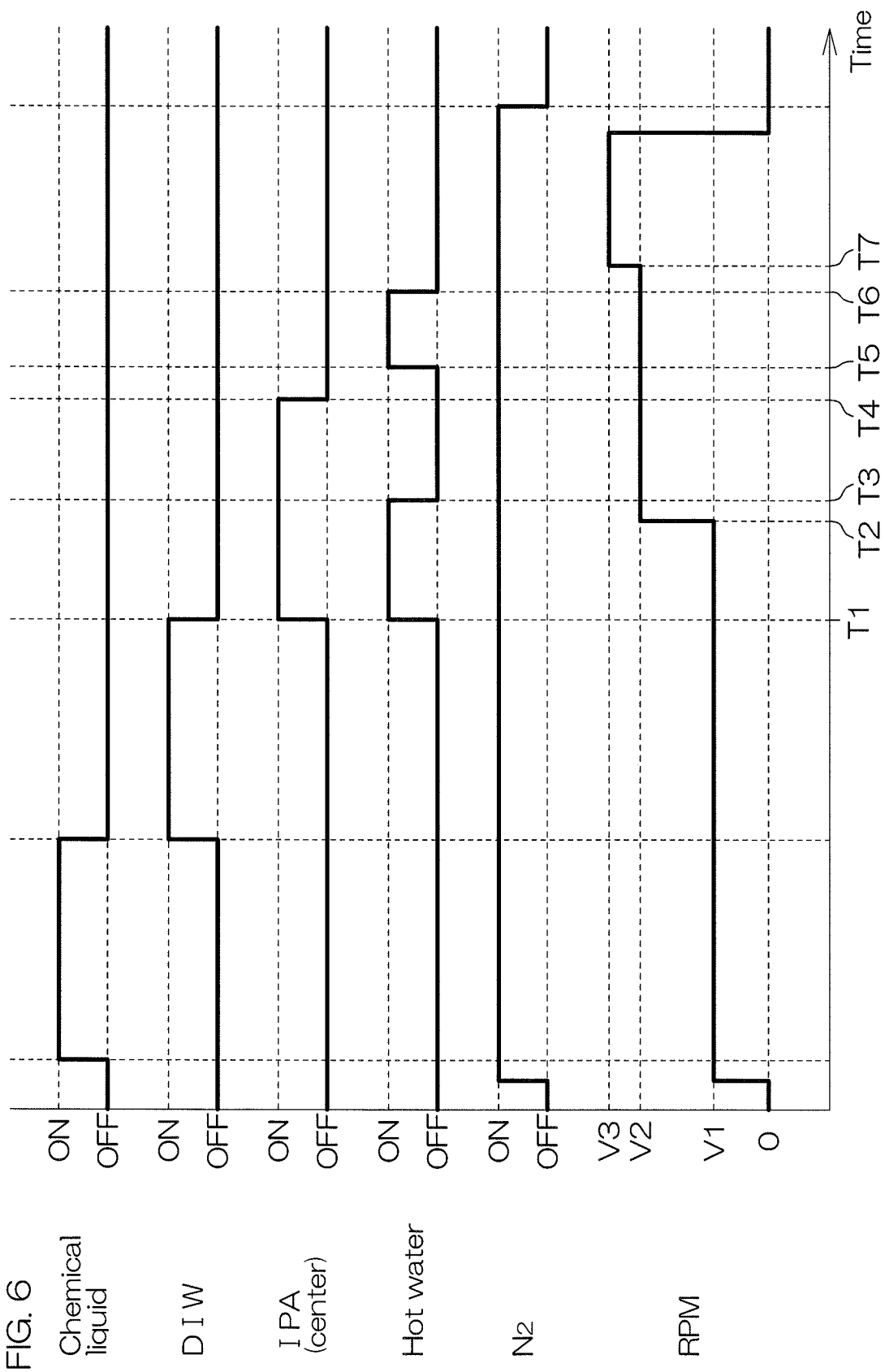

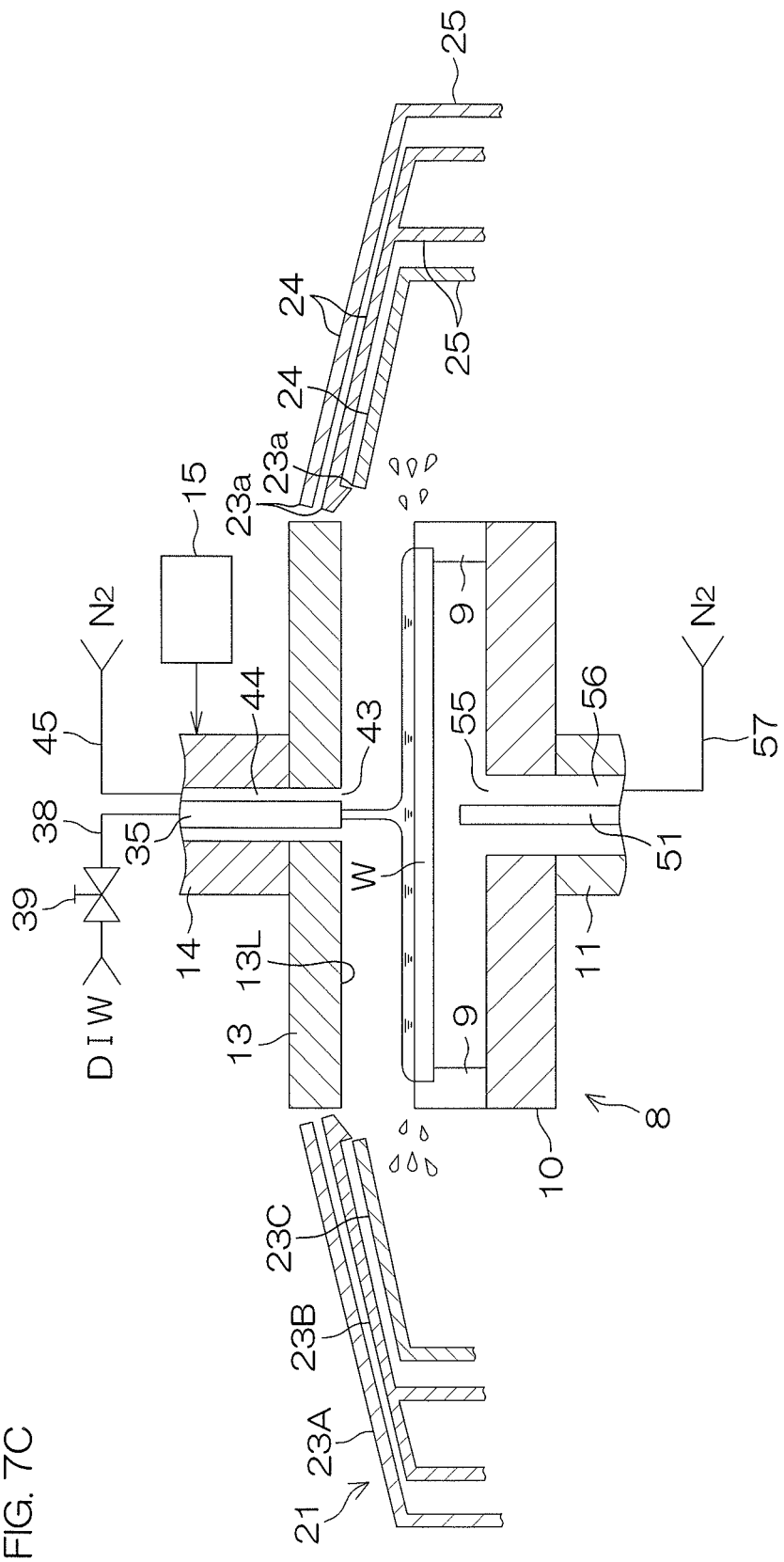

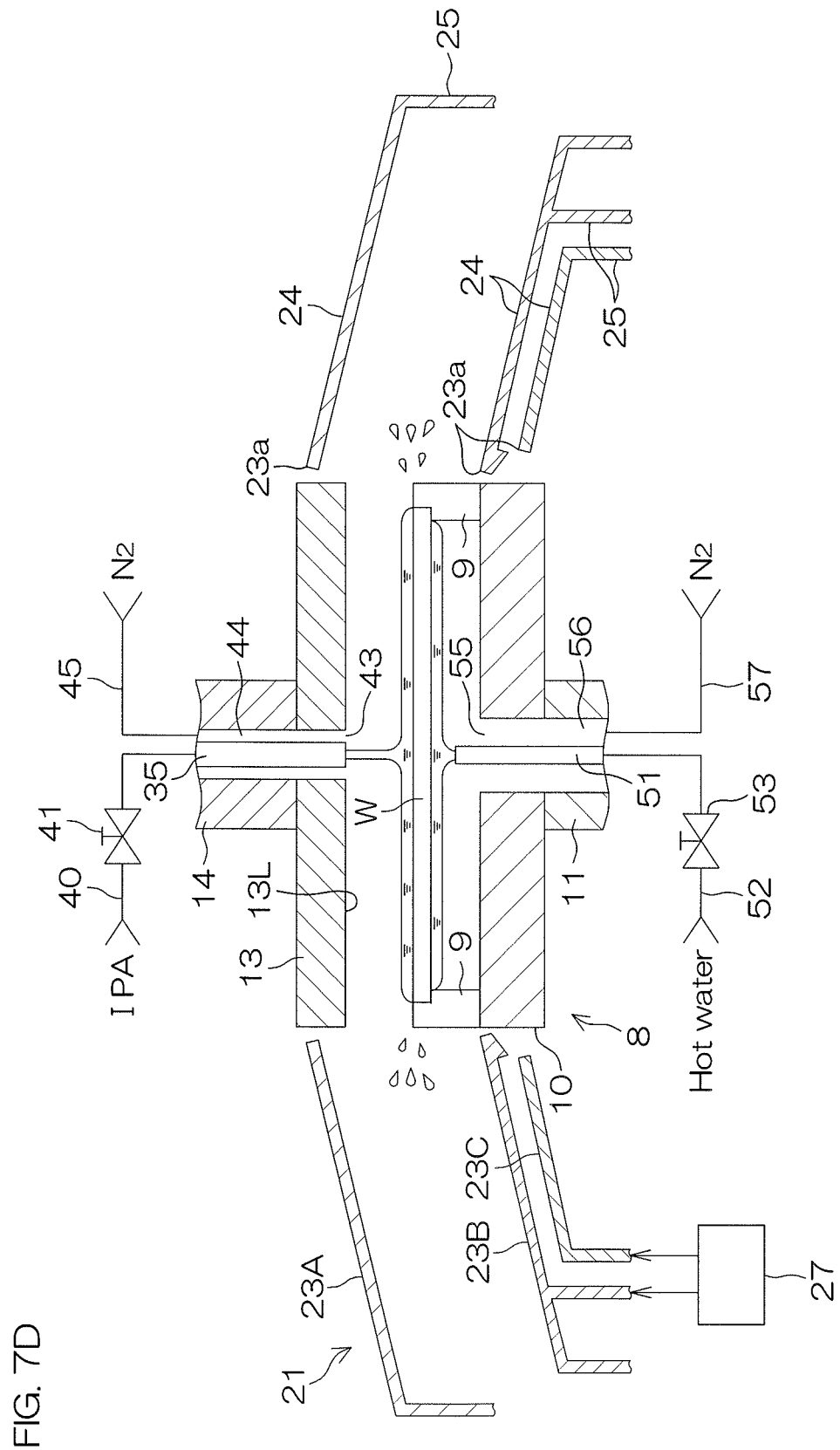

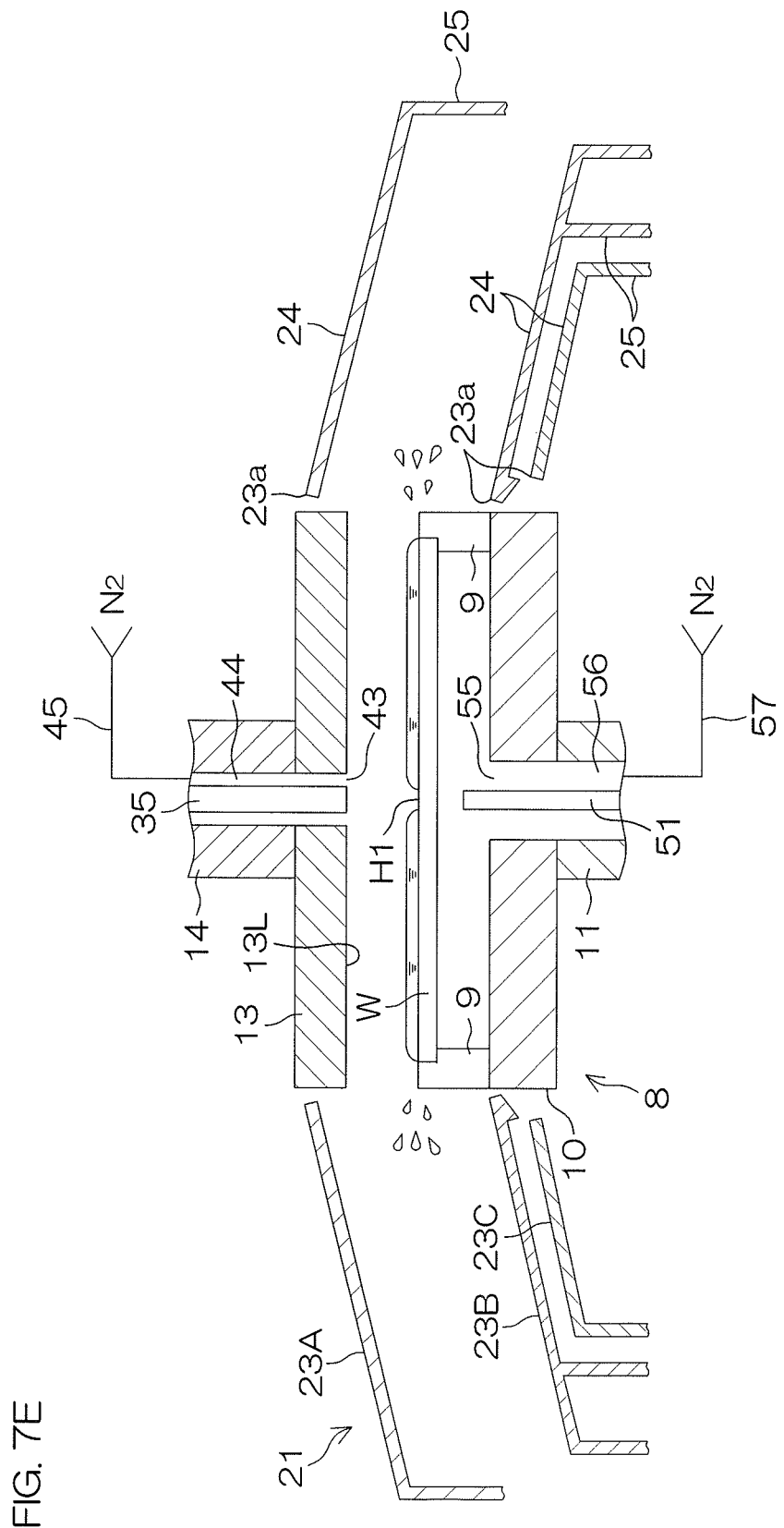

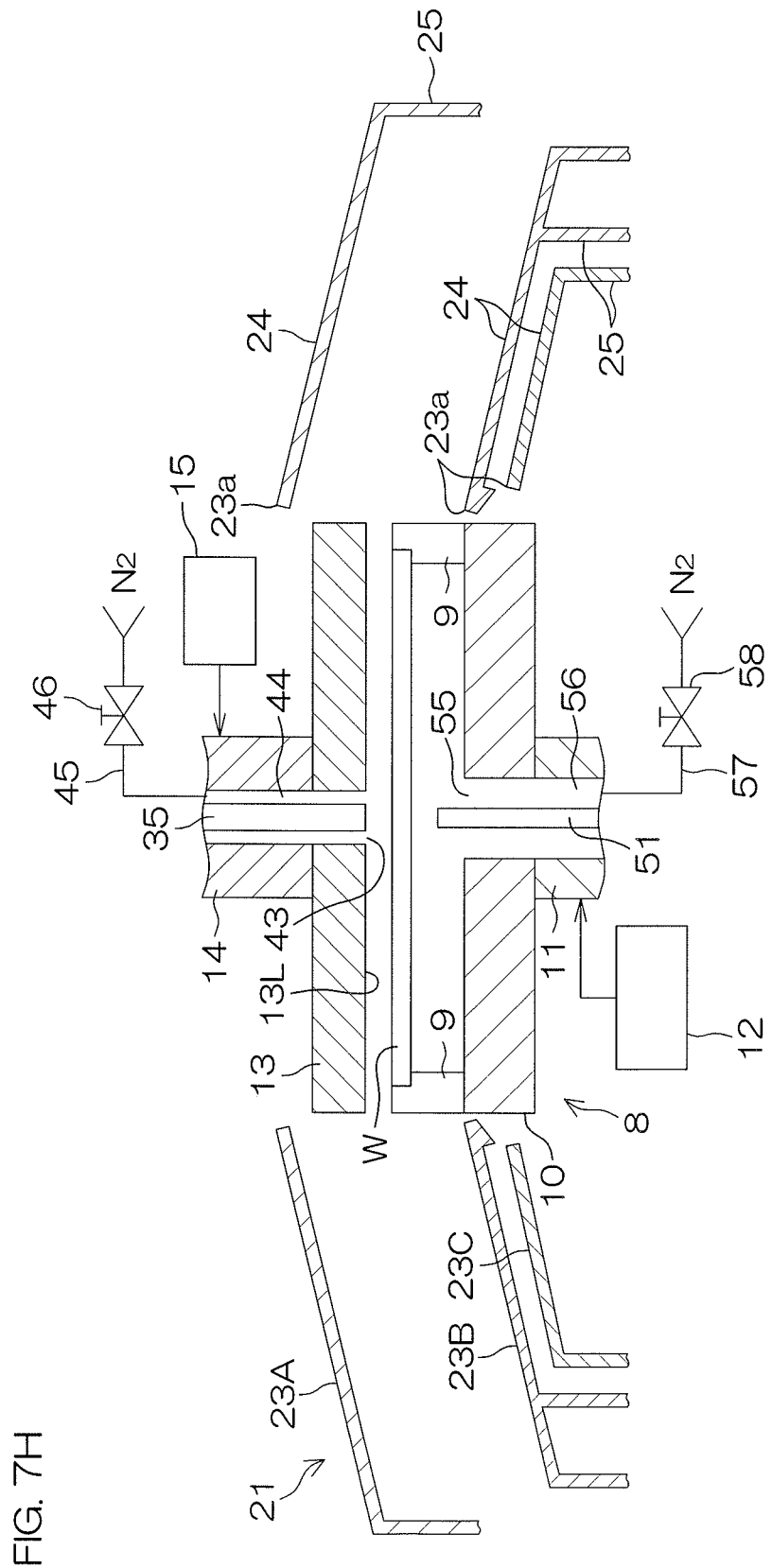

SUBSTRATE PROCESSING METHOD AND SUBSTRATE PROCESSING APPARATUS

BACKGROUND OF THE INVENTION

1. Field of the Invention

The present invention relates to a substrate processing method and a substrate processing apparatus which process a substrate. Substrates to be processed include, for example, semiconductor wafers, substrates for liquid crystal displays, substrates for plasma displays, substrates for FEDs (field emission displays), substrates for optical disks, substrates for magnetic disks, substrates for magneto-optical disks, substrates for photomasks, ceramic substrates, substrates for solar cells, etc.

2. Description of Related Art

In manufacturing processes for semiconductor devices and liquid crystal displays, substrate processing apparatuses are used for processing substrates such as semiconductor wafers or glass panels for liquid crystal displays.

Japanese Patent No. 5139844 discloses a single substrate processing type substrate processing apparatus which processes substrates one by one. The substrate processing apparatus includes a spin chuck which rotates a substrate while holding the substrate horizontally, a center nozzle which discharges an IPA liquid (liquid of isopropyl alcohol) toward a central portion of the upper surface of the substrate, and a rear surface nozzle which discharges hot water toward a central portion of the lower surface of the substrate.

In Japanese Patent No. 5139844, a hot water nozzle is used to discharge hot water toward the central portion of the lower surface of the substrate, while the center nozzle is used to discharge the IPA liquid toward the central portion of the upper surface of the substrate. Discharge of the hot water is stopped before stoppage of discharge of the IPA liquid. After discharge of the IPA liquid has been stopped, the substrate is rotated at a high speed to remove the IPA liquid and the hot water from the substrate. Thereby, the substrate is dried.

Japanese Patent No. 5139844 does not disclose or suggest supply of the hot water to the lower surface of the substrate after supply of the IPA liquid to the upper surface of the substrate is stopped.

SUMMARY OF THE INVENTION

A preferred embodiment of the present invention provides a substrate processing method including, a low surface tension liquid supplying step of replacing a rinse liquid on a substrate with a low surface tension liquid lower in surface tension than the rinse liquid and forming a liquid film of the low surface tension liquid covering an upper surface of the substrate by supplying the low surface tension liquid to the upper surface of the substrate to which the rinse liquid is adhering and which is held horizontally while rotating the substrate about a vertical rotation axis passing through a central portion of the substrate, a hole forming step of forming, after the low surface tension liquid supplying step is started, a hole at a central portion of the liquid film of the low surface tension liquid and exposing a central portion of the upper surface of the substrate from the liquid film of the low surface tension liquid by stopping supply of the low surface tension liquid to the central portion of the upper surface of the substrate while rotating the substrate around the rotation axis, a hole expanding step of expanding the hole to an outer circumference of the substrate while rotating the substrate around the rotation axis after the hole forming step, a drying step of shaking off a liquid adhering to the substrate and drying the substrate by rotating the substrate around the rotation axis after the hole expanding step, a first heating liquid supplying step of supplying a heating liquid having a temperature higher than a room temperature to a lower surface of the substrate in parallel with at least a portion of the low surface tension liquid supplying step and thereafter stopping supply of the heating liquid to the lower surface of the substrate before the hole forming step is started, and a second heating liquid supplying step of supplying, after the hole expanding step is ended, the heating liquid to the lower surface of the substrate while rotating the substrate around the rotation axis and thereafter stopping supply of the heating liquid to the lower surface of the substrate before the drying step is started.

According to this arrangement, the low surface tension liquid is supplied to the upper surface of the substrate, with the horizontally-held substrate being rotated. Accordingly, there is formed the liquid film of the low surface tension liquid which covers the upper surface of the substrate to replace the rinse liquid on the substrate with the low surface tension liquid. Thereafter, the hole is formed at the central portion of the liquid film of the low surface tension liquid, thereby exposing the central portion of the upper surface of the substrate from the liquid film of the low surface tension liquid. Then, there is implemented the hole expanding step in which an outer periphery of the hole is expanded up to an outer circumference of the substrate, thereby expelling the liquid film of the low surface tension liquid from the upper surface of the substrate. Thereafter, the substrate is rotated to dry the substrate.

The heating liquid having a higher temperature than a room temperature is supplied to the lower surface of the substrate at least partially in parallel with the low surface tension liquid supplying step. The substrate and the low surface tension liquid on the substrate are heated by the heating liquid which has been supplied to the lower surface of the substrate. Thereby, the rinse liquid is replaced with the low surface tension liquid in an accelerated manner.

Supply of the heating liquid is resumed after the outer periphery of the hole has been expanded up to the outer circumference of the substrate (second heating liquid supplying step). Thereby, heating of the substrate by the heating liquid is resumed. Thereafter, a liquid which adheres to the substrate is shaken off to dry the substrate. Even if droplets of the low surface tension liquid, which are small to such a degree that they are not visible with the naked eye, remain on the substrate after completion of the hole expanding step, these droplets of the low surface tension liquid will quickly evaporate due to heating of the substrate by the heating liquid in the second heating liquid supplying step. Therefore, it is possible to prevent a pattern collapse on the substrate resulting from the remaining droplets.

Further, discharge of the heating liquid is temporarily stopped until the outer periphery of the hole reaches the outer circumference of the substrate before formation of the hole in the liquid film of the low surface tension liquid. Therefore, while discharge of the heating liquid is stopped, the hole is formed at the central portion of the liquid film of the low surface tension liquid, and the liquid film of the low surface tension liquid is expelled from the upper surface of the substrate. That is, where a boundary between gas, liquid (low surface tension liquid) and solid (substrate) is within the upper surface of the substrate, discharge of the heating liquid is stopped. Thereby, steam and mist of the heating liquid are produced in a decreased amount, which makes it possible to suppress or prevent the mist and steam from adhering to an exposed region within the upper surface of the substrate.

Where a boundary between gas, liquid and solid is present within the upper surface of the substrate, steam and mist of another liquid adhere to an exposed region which is not covered by the liquid on the upper surface of the substrate, by which particles remaining on the substrate after being dried are increased in amount. Supply of the heating liquid is stopped when the upper surface of the substrate is partially exposed from the liquid film of the low surface tension liquid, thus making it possible to suppress or prevent the above-described adhesion. Thereby, it is possible to decrease particles remaining on the substrate after drying and also to enhance cleanliness of the substrate.

In the preferred embodiment, at least one of the following features may be added to the substrate processing method.

A period of time from the time when the first heating liquid supplying step is ended to the time when supply of the low surface tension liquid to the central portion of the upper surface of the substrate is stopped in the hole forming step is longer than a period of time from the time when supply of the heating liquid is started in the second heating liquid supplying step to the time when supply of the heating liquid is stopped in the second heating liquid supplying step.

According to this arrangement, after elapse of a certain period of time from stoppage of supply of the heating liquid, supply of the low surface tension liquid to the central portion of the upper surface of the substrate is stopped to form the hole at the central portion of the liquid film of the low surface tension liquid. Steam and mist of the heating liquid are produced when the heating liquid is supplied. The steam, etc., can enter a space above the substrate. When supply of the heating liquid is stopped, steam and mist of the heating liquid floating in the space above the substrate are decreased. Therefore, a period of time from the time when supply of the heating liquid is stopped to the time when supply of the low surface tension liquid is stopped is lengthened, thus making it possible to suppress or prevent steam, etc., of the heating liquid from adhering to an exposed region within the upper surface of the substrate.

The hole forming step is a step of stopping, after the low surface tension liquid supplying step is started, supply of the low surface tension liquid to the central portion of the upper surface of the substrate in a state in which a temperature of the central portion of the substrate is higher than a temperature of the low surface tension liquid to be supplied to the upper surface of the substrate.

When supply of the heating liquid is stopped, a temperature of the central portion of the substrate is lowered gradually, despite a decrease in steam and mist of the heating liquid which float in a space above the substrate. If a period of time from the time when supply of the heating liquid is stopped to the time when supply of the low surface tension liquid to the central portion of the upper surface of the substrate is stopped is too long, the temperature of the central portion of the substrate is lowered to a level of a room temperature. When the temperature of the central portion of the substrate is low, the low surface tension liquid will evaporate in a decreased amount, thereby increasing a period of time during which the hole is formed in the liquid film of the low surface tension liquid.

According to this arrangement, there is extended a period of time from the time when supply of the heating liquid is stopped to the time when supply of the low surface tension liquid to the central portion of the upper surface of the substrate is stopped, as long as the central portion of the substrate is higher in temperature than the low surface tension liquid before landing on the upper surface of the substrate. Thereby, it is possible to suppress or prevent steam and mist of the heating liquid from adhering to an exposed region within the upper surface of the substrate, while suppressing or preventing an increase in the time during which the hole is formed in the liquid film of the low surface tension liquid.

Timing at which supply of the low surface tension liquid to the central portion of the upper surface of the substrate is stopped in the hole forming step may be determined based on a detection value of a temperature sensor which detects a temperature of the substrate or may be determined based on experimental results or rule of thumb. In the latter case, the timing of stopping the supply based on the experimental results or rule of thumb may be stored at a storage device of the controller. Further, the timing of stopping the supply may coincide with timing at which supply of the low surface tension liquid to the upper surface of the substrate is stopped in the low surface tension liquid supplying step or may be different from the timing.

A minimum value of a rotation speed of the substrate in the second heating liquid supplying step is larger a minimum value of a rotation speed of the substrate in the first heating liquid supplying step.

According to this arrangement, a rotation speed of the substrate on second-time supply of the heating liquid is larger in minimum value than a rotation speed of the substrate on first-time supply of the heating liquid. A relatively large centrifugal force is applied to the heating liquid on the second supply of the heating liquid. Therefore, the heating liquid which flows outward along the lower surface of the substrate is less likely to flow into the upper surface of the substrate. Accordingly, it is possible to suppress or prevent steam and mist of the liquid from adhering to the upper surface of the substrate.

A period of time during which the heating liquid is supplied in the second heating liquid supplying step is shorter than a period of time during which the heating liquid is supplied in the first heating liquid supplying step.

According to this arrangement, a period of time from the time when the second-time supply of the heating liquid is started to the time when the second-time supply of the heating liquid is stopped is shorter than a period of time from the time when the first-time supply of the heating liquid is started to the time when the first-time supply of the heating liquid is stopped. As described above, since the period of time during which the heating liquid is supplied at the second time is shorter, it is possible to decrease an amount of steam and mist produced from the heating liquid and also to suppress or prevent them from adhering to the upper surface of the substrate.

The substrate processing method further includes a closed-space forming step of locating an upper end of a tubular guard, which surrounds the substrate and a shielding member in a plan view, at a position higher than a facing surface of the shielding member disposed above the substrate while causing the facing surface of the shielding member to face the upper surface of the substrate in parallel with the hole expanding step.

According to this arrangement, the facing surface of the shielding member is disposed above the substrate. The upper end of the guard which corresponds to an inner peripheral edge of the guard surrounds the substrate and the shielding member in a plan view. The upper end of the guard is disposed at a position higher than the facing surface of the shielding member. Therefore, a space between the upper surface of the substrate and the facing surface of the shielding member is surrounded by the guard. Thereby, a space between the upper surface of the substrate and the facing surface of the shielding member can be raised in degree of sealing to decrease an amount of an atmosphere which enters the space. It is, therefore, possible to process the substrate inside a closed space.

The space between the upper surface of the substrate and the facing surface of the shielding member is blocked from an atmosphere above the shielding member by the shielding member. The facing surface of the shielding member may be larger or smaller than the substrate in a plan view or may be equal in size to the substrate in a plan view. That is, where the facing surface and the substrate are circular in a plan view, the facing surface may be larger or smaller in outer diameter than the substrate or may be equal in outer diameter to the substrate. Where the facing surface is larger in size than the substrate in a plan view or equal in size to the substrate, it is possible to further decrease an amount of the atmosphere which enters the space between the upper surface of the substrate and the facing surface of the shielding member.

The low surface tension liquid supplying step includes a scanning step of causing a landing position of the low surface tension liquid with respect to the upper surface of the substrate to move outward by moving a low surface tension liquid supplying port, which supplies the low surface tension liquid, between the facing surface of the shielding member and the upper surface of the substrate in parallel with the hole expanding step.

According to this arrangement, the low surface tension liquid supplying port which supplies the low surface tension liquid is disposed at the space between the upper surface of the substrate and the facing surface of the shielding member. The space between the upper surface of the substrate and the facing surface of the shielding member is surrounded by the guard. The low surface tension liquid supplying port is moved along the upper surface of the substrate inside the closed space, thereby expanding the hole formed in the liquid film of the low surface tension liquid. Therefore, it is possible to control a position of an inner peripheral edge of the liquid film of the low surface tension liquid with a high accuracy, while the atmosphere which enters the space between the upper surface of the substrate and the facing surface of the shielding member is decreased in amount.

Another preferred embodiment of the present invention provides a substrate processing apparatus including a substrate holding unit which rotates a substrate around a vertical rotation axis passing through a central portion of the substrate while holding the substrate horizontally to which a rinse liquid adhering, a low surface tension liquid nozzle which discharges a low surface tension liquid lower in surface tension than the rinse liquid to an upper surface of the substrate held by the substrate holding unit, a lower surface nozzle which discharges a heating liquid having a higher temperature than a room temperature to a lower surface of the substrate held by the substrate holding unit, and a controller which controls the substrate processing apparatus.

The controller conducts a low surface tension liquid supplying step of replacing the rinse liquid on the substrate with the low surface tension liquid and forming a liquid film of the low surface tension liquid covering the upper surface of the substrate by causing the low surface tension liquid nozzle to supply the low surface tension liquid to the upper surface of the substrate to which the rinse liquid is adhering and causing the substrate holding unit to rotate the substrate around the rotation axis, a hole forming step of forming, after the low surface tension liquid supplying step is started, a hole at a central portion of the liquid film of the low surface tension liquid and exposing a central portion of the upper surface of the substrate from the liquid film of the low surface tension liquid by causing the low surface tension liquid nozzle to stop supply of the low surface tension liquid to the central portion of the upper surface of the substrate and causing the substrate holding unit to rotate the substrate around the rotation axis, a hole expanding step of expanding the hole to an outer circumference of the substrate and causing the substrate holding unit to rotate the substrate around the rotation axis, a drying step of shaking off a liquid adhering to the substrate and drying the substrate by causing the substrate holding unit to rotate the substrate around the rotation axis after the hole expanding step, a first heating liquid supplying step of causing the lower surface nozzle to supply the heating liquid to the lower surface of the substrate in parallel with at least a portion of the low surface tension liquid supplying step and thereafter causing the lower surface nozzle to stop supply of the heating liquid to the lower surface of the substrate before the hole forming step is started, and a second heating liquid supplying step of causing, after the hole expanding step is ended, the lower surface nozzle to supply the heating liquid to the lower surface of the substrate while causing the substrate holding unit to rotate the substrate around the rotation axis and thereafter causing the lower surface nozzle to stop supply of the heating liquid to the lower surface of the substrate before the drying step is started. According to this arrangement, it is possible to obtain effects similar to the previously described effects.

The above and other objects, features, and effects of the present invention will become more apparent from the following detailed description of the preferred embodiments with reference to the attached drawings.

BRIEF DESCRIPTION OF THE DRAWINGS

FIG. 6 is a time chart which shows motions of the substrate processing apparatus when the first processing example is performed.

FIG. 7C is a schematic sectional view which shows a state of the substrate processing apparatus when the rinse liquid supplying step is performed.

FIG. 7D is a schematic sectional view which shows a state of the substrate processing apparatus when an IPA supplying step and a first hot water supplying step are performed.

FIG. 7E is a schematic sectional view which shows a state of the substrate processing apparatus when a hole forming step of a liquid film expelling step are performed.

FIG. 7H is a schematic sectional view which shows a state of the substrate processing apparatus when a drying step is performed.

DETAILED DESCRIPTION OF PREFERRED EMBODIMENTS

Figure 1:
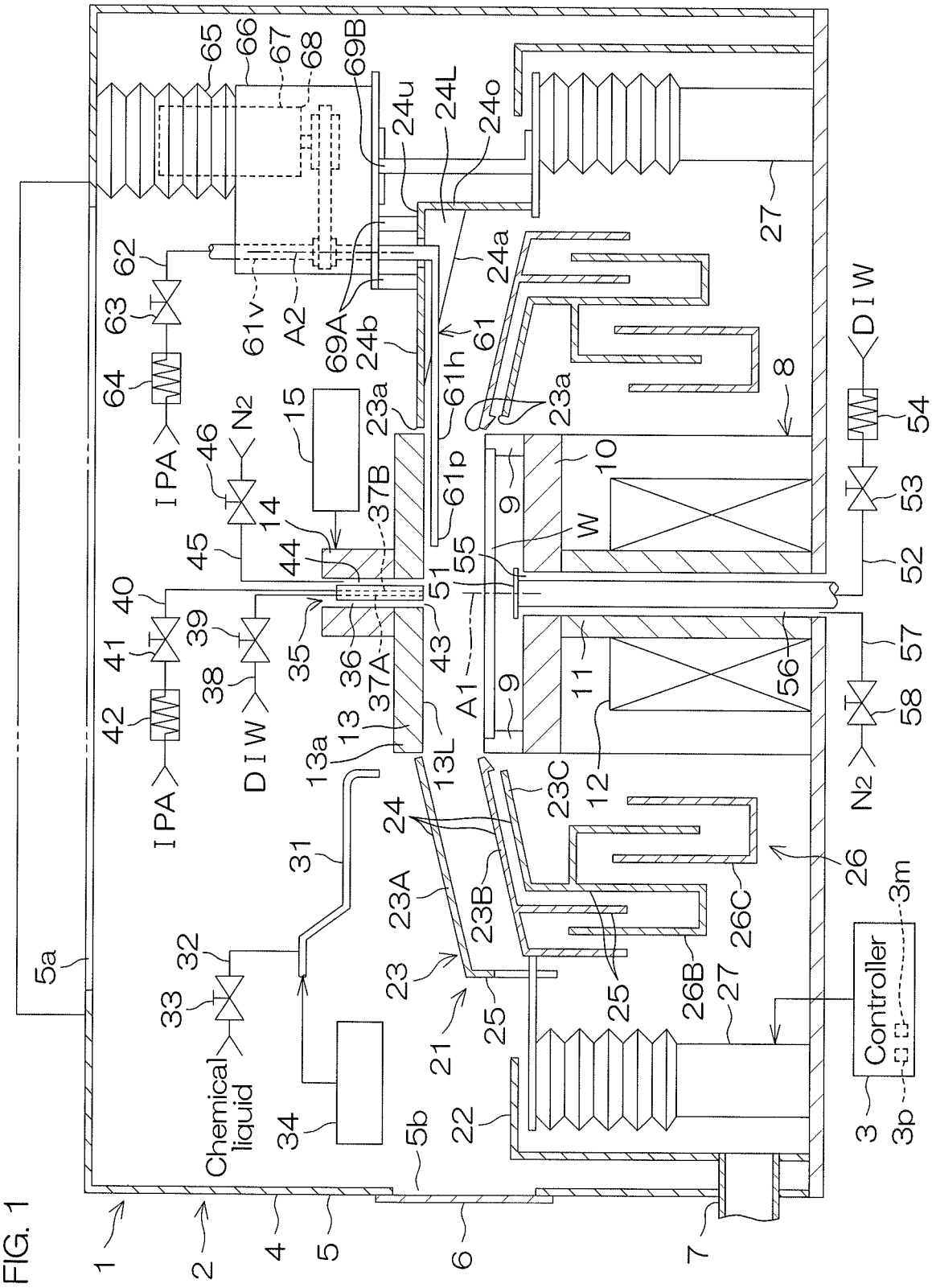
FIG. 1 is a schematic horizontal view of an interior of a processing unit included in a substrate processing apparatus according to a first preferred embodiment of the present invention.
Figure 2:
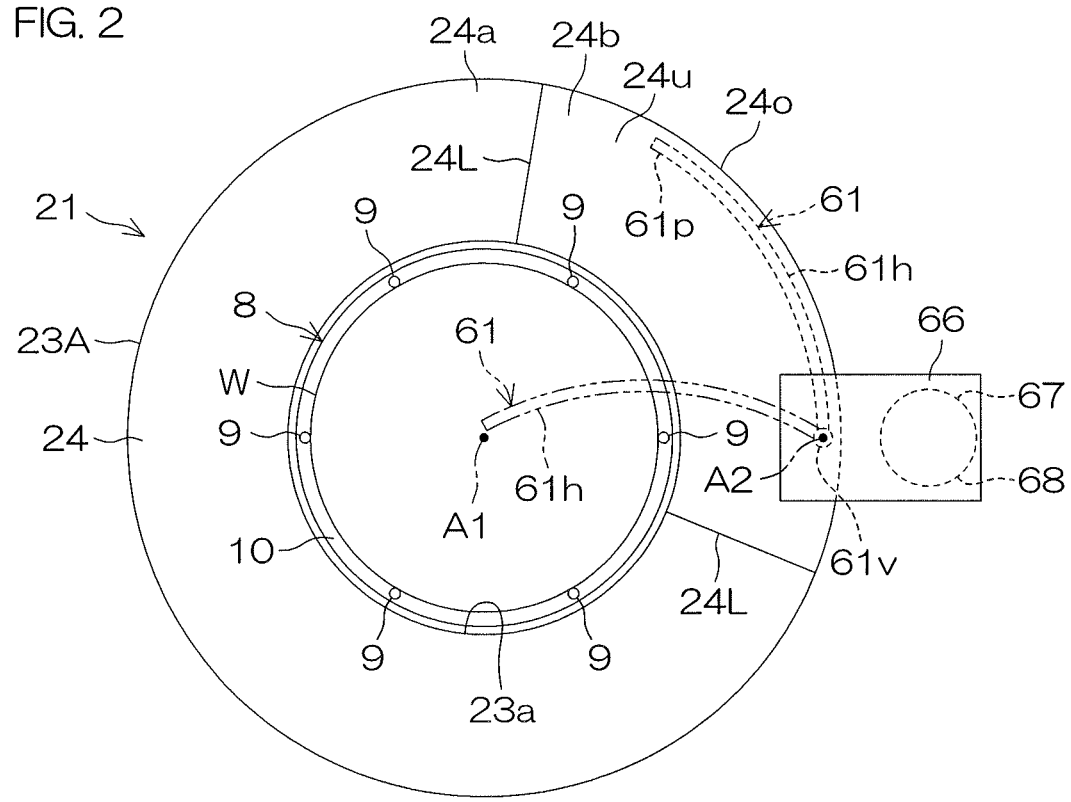
FIG. 2 is a schematic view of a spin chuck and a processing cup in a plan view.

FIG. 1 is a schematic horizontal view of an interior of a processing unit 2 included in a substrate processing apparatus 1 according to a first preferred embodiment of the present invention. FIG. 2 is a schematic view of a spin chuck 8 and a processing cup 21 in a plan view.

As shown in FIG. 1, the substrate processing apparatus 1 is a single substrate processing type apparatus which processes disc-shaped substrates W such as a semiconductor wafer one by one. The substrate processing apparatus 1 includes a plurality of processing units 2 which process the substrate W with a processing fluid such as a processing liquid or a processing gas, a transfer robot (unillustrated) which transfers the substrate W to the processing units 2 and a controller 3 which controls the substrate processing apparatus 1. The controller 3 is a computer which includes a memory 3m that stores information such as programs and a processor 3p that controls the substrate processing apparatus 1 according to the information stored in the memory 3m.

The processing unit 2 includes a box-shaped chamber 4 which has an inner space, a spin chuck 8 which rotates a substrate W around a vertical rotation axis A1 passing through a central portion of the substrate W while holding the substrate W horizontally inside the chamber 4, a shielding member 13 which faces an upper surface of the substrate W, and a tubular processing cup 21 which receives a processing liquid expelled outward from the substrate W and the spin chuck 8. The spin chuck 8 is one example of the substrate holding unit.

The chamber 4 includes a box-shaped partition wall 5 having a carry-in/carry-out port 5b through which the substrate W passes and a shutter 6 which opens and closes the carry-in/carry-out port 5b. Clean air which is filtered air is constantly supplied from a ventilation port 5a provided at an upper portion of the partition wall 5 into the chamber 4. A gas inside the chamber 4 is expelled from the chamber 4 through an exhaust duct 7 connected to a bottom portion of the processing cup 21. Thereby, a downflow of the clean air is constantly formed inside the chamber 4.

The spin chuck 8 includes a circular disk-shaped spin base 10 which is held in a horizontal posture, a plurality of chuck pins 9 which hold the substrate W in a horizontal posture above the spin base 10, a spin shaft 11 which extends below from a central portion of the spin base 10, and a spin motor 12 which rotates the spin base 10 and the plurality of chuck pins 9 by rotating the spin shaft 11. The spin chuck 8 is not limited to a clamping type chuck which brings the plurality of chuck pins 9 into contact with an outer circumferential surface of the substrate W but may be a vacuum type chuck which holds the substrate W horizontally by allowing a rear surface (lower surface) of the substrate W as a non-device forming surface to be adsorbed on an upper surface of the spin base 10.

The shielding member 13 is disposed above the spin chuck 8. The shielding member 13 is a circular plate portion 13a greater in outer diameter than the substrate W. The shielding member 13 is supported in a horizontal posture by a support shaft 14 which extends in a vertical direction. A center line of the shielding member 13 is disposed on the rotation axis A1. A lower surface 13L of the shielding member 13 is larger in outer diameter than the substrate W. The lower surface 13L of the shielding member 13 is parallel with the upper surface of the substrate W and faces the upper surface of the substrate W. The lower surface 13L of the shielding member 13 is one example of the facing surface which faces the upper surface of the substrate W.

The processing unit 2 includes a shielding member elevating/lowering unit 15 which is coupled to the shielding member 13 via the support shaft 14. The processing unit 2 may be provided with a shielding member rotating unit which rotates the shielding member 13 around the center line of the shielding member 13. The shielding member elevating/lowering unit 15 elevates and lowers the shielding member 13 between a lower position (refer to FIG. 7H) at which the lower surface 13L of the shielding member 13 comes close to the upper surface of the substrate W and an upper position (a position indicated in FIG. 1) which is above the lower position.

The processing cup 21 includes a plurality of guards 23 which receive a liquid expelled outward from the spin chuck 8, a plurality of cups 26 which receive the liquid guided downward by the plurality of guards 23, and a cylindrical outer wall member 22 which surrounds the plurality of guards 23 and the plurality of cups 26. FIG. 1 shows an example in which three guards 23 (a first guard 23A, a second guard 23B and a third guard 23C) and two cups 26 (a second cup 26B and a third cup 26C) are provided.

Where a reference is made to each of the first guard 23A, the second guard 23B and the third guard 23C, they are hereinafter simply referred to as the guard 23. Similarly, where a reference is made to each of the second cup 26B and the third cup 26C, they are simply referred to as the cup 26. Further, there is a case that "first" is added to the beginning of a configuration corresponding to the first guard 23A. There is, for example, a case that the tubular portion 25 corresponding to the first guard 23A is referred to as a "first tubular portion 25." This is also similar to a configuration corresponding to each of the second guard 23B to the third guard 23C.

The guard 23 includes a cylindrical tubular portion 25 which surrounds the spin chuck 8 and a circular-annular ceiling portion 24 which extends obliquely upward from an upper end portion of the tubular portion 25 to the rotation axis A1. The first ceiling portion 24 to the third ceiling portion 24 are overlapped in a vertical direction from the first ceiling portion 24 to the third ceiling portion 24 in order from above. The first tubular portion 25 to the third tubular portion 25 are disposed concentrically from the first tubular portion 25 to the third tubular portion 25 in order from the outside. An upper end of each of the first ceiling portion 24 to the third ceiling portion 24 corresponds to an upper end 23a of each of the first guard 23A to the third guard 23C. The upper end of each of the first ceiling portion 24 to the third ceiling portion 24 surrounds the spin base 10 and the shielding member 13 in a plan view.

The plurality of cups 26 are disposed concentrically from the second cup 26B and the third cup 26C in order from the outside. The third cup 26C surrounds the spin chuck 8. The third cup 26C is disposed below from the upper end of the outer wall member 22. The third cup 26C is fixed to the partition wall 5 of the chamber 4. The second cup 26B is formed integrally with the second guard 23B and moves together with the second guard 23B in the vertical direction. The second guard 23B may be movable in relation to the second cup 26B.

The guard 23 is able to move in the vertical direction between an upper position at which the upper end 23a of the guard 23 is positioned above from a substrate holding position at which the spin chuck 8 holds the substrate W and a lower position at which the upper end 23a of the guard 23 is positioned below from the substrate holding position. The processing unit 2 includes a guard elevating/lowering unit 27 which moves individually the plurality of guards 23 in the vertical direction. The guard elevating/lowering unit 27 arranges the guard 23 at any given position from the upper position to the lower position. The guard elevating/lowering unit 27 includes, for example, an electric motor which generates power to move the guard 23 in the vertical direction as well as a ball screw and a ball nut which convert the rotation of the electric motor to the vertical movement of the guard 23.

The processing unit 2 includes a chemical liquid nozzle 31 which discharges a chemical liquid downward toward the upper surface of the substrate W. The chemical liquid nozzle 31 is connected to chemical liquid piping 32 which guides the chemical liquid. When a chemical liquid valve 33 which is placed on the chemical liquid piping 32 is opened, the chemical liquid is discharged continuously downward from a discharge port of the chemical liquid nozzle 31. The chemical liquid may be a liquid which contains at least one of sulfuric acid, nitric acid, hydrochloric acid, hydrofluoric acid, phosphoric acid, acetic acid, ammonia water, hydrogen peroxide water, an organic acid (such as citric acid or oxalic acid), organic alkali (such as TMAH: tetramethylammonium hydroxide), a surfactant, and a corrosion preventing agent or may be a liquid other than these liquids.

Although not shown in the drawing, the chemical liquid valve 33 includes a valve body which forms a flow channel, a valve element which is disposed inside the flow channel and an actuator which moves the valve element. This is also similar to other valves. The actuator may be a pneumatic actuator or an electric actuator or may be an actuator other than these actuators. The controller 3 controls the actuator to open or close the chemical liquid valve 33.

The chemical liquid nozzle 31 is a scanning nozzle which can move inside the chamber 4. The chemical liquid nozzle 31 is connected to a nozzle movement unit 34 which moves the chemical liquid nozzle 31 at least in one of a perpendicular direction and a horizontal direction. The nozzle movement unit 34 allows the chemical liquid nozzle 31 to move horizontally between a processing position (refer to FIG. 7A) at which a chemical liquid discharged from the chemical liquid nozzle 31 lands on the upper surface of the substrate W and a retraction position at which the chemical liquid nozzle 31 is positioned around the spin chuck 8 in a plan view.

The processing unit 2 includes a center nozzle 35 which discharges a processing liquid downward via an upper central open port 43 which is opened at a central portion on the lower surface 13L of the shielding member 13. Discharge ports of the center nozzle 35 (discharge ports of a first tube 37A and a second tube 37B to be described later) which discharge the processing liquid are disposed inside a through hole which penetrates vertically through the central portion of the shielding member 13. The discharge ports of the center nozzle 35 are disposed above the upper central open port 43. An inner circumferential surface of the upper central open port 43 surrounds the rotation axis A1 of the substrate W. The center nozzle 35 is elevated and lowered together with the shielding member 13 in the perpendicular direction.

The center nozzle 35 includes a plurality of inner tubes (a first tube 37A and a second tube 37B) which discharge the processing liquid downward and a tubular casing 36 which surrounds the plurality of inner tubes. The first tube 37A, the second tube 37B and the casing 36 extend along the rotation axis A1 in the vertical direction. The inner circumferential surface of the shielding member 13 surrounds an outer circumferential surface of the casing 36, with an interval kept in a radial direction (a direction orthogonal to the rotation axis A1).

The first tube 37A is one example of the rinse liquid nozzle which discharges a rinse liquid downward toward the upper surface of the substrate W. The first tube 37A is connected to the rinse liquid piping 38 on which a rinse liquid valve 39 is placed. When the rinse liquid valve 39 is opened, the rinse liquid is supplied from the rinse liquid piping 38 to the first tube 37A and discharged downward continuously from a discharge port of the first tube 37A. The rinse liquid is, for example, pure water (DIW (deionized water)). The rinse liquid is not limited to pure water but may be any one of electrolysis ionized water, hydrogen water, ozone-treated water, and hydrochloric acid water with a diluted concentration (for example, about 10 to 100 ppm).

The second tube 37B is one example of a first solvent nozzle which discharges IPA downward toward the upper surface of the substrate W. The second tube 37B is connected to first solvent piping 40 on which a first solvent valve 41 is placed. When the first solvent valve 41 is opened, IPA is supplied from the first solvent piping 40 to the second tube 37B and continuously discharged downward from a discharge port of the second tube 37B. A first solvent heater 42 which heats IPA is placed on the first solvent piping 40. IPA higher in temperature than a room temperature (20 to 30° C.) is supplied to the second tube 37B. IPA is one example of an organic solvent which is lower in surface tension than water and higher in volatility than water. The organic solvent (liquid) which is supplied to the second tube 37B may be other organic solvents such as HFE (hydrofluoroether).

The substrate processing apparatus 1 includes upper gas piping 45 which guides a gas from a gas supply source to the upper central open port 43 of the shielding member 13 and an upper gas valve 46 which is placed on the upper gas piping 45. When the upper gas valve 46 is opened, a gas supplied from the upper gas piping 45 flows below through a tubular upper gas flow channel 44 formed by an outer circumferential surface of the center nozzle 35 and an inner circumferential surface of the shielding member 13 and discharged downward from the upper central open port 43. The gas supplied to the upper central open port 43 is nitrogen gas, for example. The gas may be other inert gases such as helium gas and argon gas or may be clean air and dry air (moisture-removed clean air).

The processing unit 2 includes a lower surface nozzle 51 which discharges a processing liquid upward toward the central portion of the lower surface of the substrate W. The lower surface nozzle 51 is fixed to the partition wall 5 of the chamber 4. Even when the spin chuck 8 rotates the substrate W, the lower surface nozzle 51 will not rotate. The lower surface nozzle 51 is inserted into a through hole which is opened at a central portion of the upper surface of the spin base 10. A discharge port of the lower surface nozzle 51 is disposed at a position higher than the upper surface of the spin base 10 and faces the central portion of the lower surface of the substrate W in the vertical direction.

The lower surface nozzle 51 is connected to hot water piping 52 on which a hot water valve 53 is placed. When the hot water valve 53 is opened, hot water is supplied from the hot water piping 52 to the lower surface nozzle 51 and continuously discharged upward from the discharge port of the lower surface nozzle 51. The hot water is pure water, the temperature of which is higher than a room temperature and also lower than a boiling point (82.6° C.) of the low surface tension liquid (IPA) supplied to the upper surface of the substrate W. A hot water heater 54 which heats the pure water is placed on the hot water piping 52. The pure water at a room temperature is heated by the hot water heater 54 and, thereafter, supplied to the lower surface nozzle 51.

The substrate processing apparatus 1 includes lower gas piping 57 which guides a gas from a gas supply source to a lower central open port 55 which is opened at the central portion of the upper surface of the spin base 10 and a lower gas valve 58 placed on the lower gas piping 57. When the lower gas valve 58 is opened, the gas supplied from the lower gas piping 57 flows above through a tubular lower gas flow channel 56 which is formed by the outer circumferential surface of the lower surface nozzle 51 and the inner circumferential surface of the spin base 10 and discharged upward from the lower central open port 55. An inner circumferential surface of the lower central open port 55 surrounds the rotation axis A1 of the substrate W. The gas supplied to the lower central open port 55 is nitrogen gas, for example. A gas other than nitrogen gas may be supplied to the lower central open port 55.

The processing unit 2 includes a second solvent nozzle 61 which discharges IPA toward the upper surface of the substrate W. The second solvent nozzle 61 includes a horizontal portion 61h which is disposed below from the upper end 23a of the first guard 23A and a perpendicular portion 61v which is disposed above the first guard 23A. Even when the first guard 23A and the second guard 23B are arranged at any position, the horizontal portion 61h is disposed between the first guard 23A and the second guard 23B. As shown in FIG. 2, the horizontal portion 61h is formed in a circular-arc shape in a plan view. The horizontal portion 61h may be formed in a linear shape in a plan view.

As shown in FIG. 1, the second solvent nozzle 61 is inserted into a through hole which penetrates through the ceiling portion 24 of the first guard 23A in the vertical direction. The perpendicular portion 61v is disposed above the through hole of the first guard 23A. The perpendicular portion 61v penetrates through a housing 66 disposed above the first guard 23A in the vertical direction. The housing 66 is supported by the first guard 23A. The perpendicular portion 61v is rotatably supported by the housing 66. The second solvent nozzle 61 is able to move in relation to the first guard 23A around a rotational movement axis A2 which corresponds to the center line of the perpendicular portion 61v. The rotational movement axis A2 is a perpendicular axis which passes through the first guard 23A.

A discharge port 61p which discharges IPA downward is provided at a tip portion (an end portion opposite to the rotational movement axis A2) of the horizontal portion 61h. The second solvent nozzle 61 is connected to second solvent piping 62 on which a second solvent valve 63 is placed. When the second solvent valve 63 is opened, IPA is supplied from the second solvent piping 62 to the second solvent nozzle 61 and continuously discharged downward from the discharge port 61p of the second solvent nozzle 61. A second solvent heater 64 which heats IPA is placed on the second solvent piping 62. IPA, the temperature of which is higher than a room temperature, is supplied to the second solvent nozzle 61.

The processing unit 2 includes a scanning unit 67 which allows the second solvent nozzle 61 to move rotationally around the rotational movement axis A2 between a processing position at which IPA discharged from the second solvent nozzle 61 lands on the upper surface of the substrate W and a retraction position at which the second solvent nozzle 61 is positioned around the spin chuck 8 in a plan view. The scanning unit 67 includes an electric motor 68 which generates power to turn the second solvent nozzle 61. The electric motor 68 may be a coaxial motor coaxial with the perpendicular portion 61v of the second solvent nozzle 61 or may be coupled to the perpendicular portion 61v of the second solvent nozzle 61 via two pulleys and an endless belt.

When the second solvent nozzle 61 is disposed at the retraction position (the position indicated by the dotted line in FIG. 2), the horizontal portion 61h of the second solvent nozzle 61 is entirely overlapped with the first guard 23A. When the second solvent nozzle 61 is disposed at the processing position (the position indicated by the double dotted and dashed line in FIG. 2), the tip portion of the horizontal portion 61h is disposed inside from the upper end 23a of the first guard 23A, and the second solvent nozzle 61 is overlapped with the substrate W. The processing position includes a central processing position (a position indicated by the double dotted and dashed line in FIG. 2) at which IPA discharged from the second solvent nozzle 61 lands on the central portion of the upper surface of the substrate W and an outer circumference processing position at which IPA discharged from the second solvent nozzle 61 lands on an outer circumference portion of the upper surface of the substrate W.

The ceiling portion 24 of the first guard 23A includes an annular inclined portion 24a which extends obliquely upward from an upper end portion of the tubular portion 25 of the first guard 23A to the rotation axis A1 and a protrusion portion 24b which protrudes upward from the inclined portion 24a. The inclined portion 24a and the protrusion portion 24b are placed side by side in a circumferential direction (a direction around the rotation axis A1). The protrusion portion 24b includes a pair of side walls 24L which extend upward from the inclined portion 24a, an upper wall 24u which is disposed between upper ends of the pair of side walls 24L and an external wall 24o which is disposed between outer ends of the pair of side walls 24L. The protrusion portion 24b forms a housing space which is recessed upward from a lower surface of the inclined portion 24a of the first guard 23A.

When the second solvent nozzle 61 is disposed at the retraction position, the horizontal portion 61h of the second solvent nozzle 61 is entirely overlapped with the protrusion portion 24b in a plan view and housed in the housing space. As shown in FIG. 2, at this time, the tip portion of the horizontal portion 61h at which the discharge port 61p is provided is disposed outside from the upper end 23a of the first guard 23A. Where the second solvent nozzle 61 is disposed at the retraction position, the upper end portion of the first guard 23A and the upper end portion of the second guard 23B can be brought closer to each other in the vertical direction. Thereby, it is possible to decrease an amount of the liquid which enters a space between the first guard 23A and the second guard 23B.

As described previously, the second solvent nozzle 61 is supported by the housing 66. Likewise, the scanning unit 67 is supported by the housing 66. The electric motor 68 of the scanning unit 67 is disposed inside a bellows 65 which can expand and contract in the vertical direction. The housing 66 is supported by the first guard 23A via a first bracket 69A and supported by the guard elevating/lowering unit 27 via a second bracket 69B. When the guard elevating/lowering unit 27 elevates and lowers the first guard 23A, the housing 66 is also elevated and lowered. Thereby, the second solvent nozzle 61 and the scanning unit 67 are elevated and lowered together with the first guard 23A.

Figure 3:
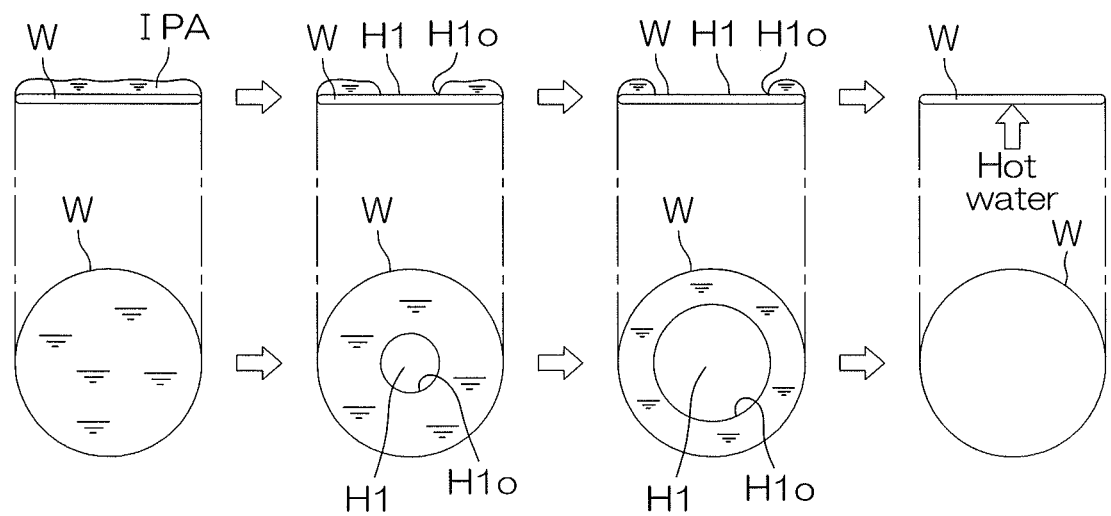
FIG. 3 is a schematic view which briefly describes one example of processing a substrate by the substrate processing apparatus.

FIG. 3 is a schematic view which briefly describes one example of processing a substrate W by the substrate processing apparatus 1. Each of FIG. 4A to FIG. 4D is a schematic sectional view of the substrate W which shows a state of the substrate W where the substrate W is heated or not heated after the outer periphery H1o of the exposure hole H1 formed on a liquid film of IPA is expanded to an outer circumference of the substrate W, and the liquid film of IPA is expelled completely from the upper surface of the substrate W.

Figure 4A:
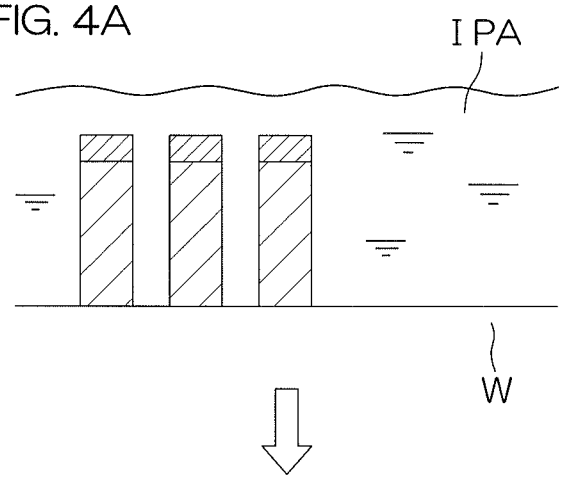
FIG. 4A is a schematic sectional view of the substrate which shows a state of the substrate before a liquid film of IPA is expelled from an upper surface of the substrate.
Figure 4B:
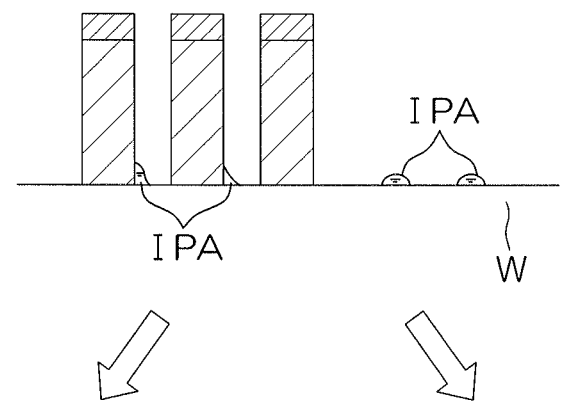
FIG. 4B is a schematic sectional view of the substrate which shows a state of the substrate after the liquid film of IPA is expelled from the upper surface of the substrate.
Figure 4C:
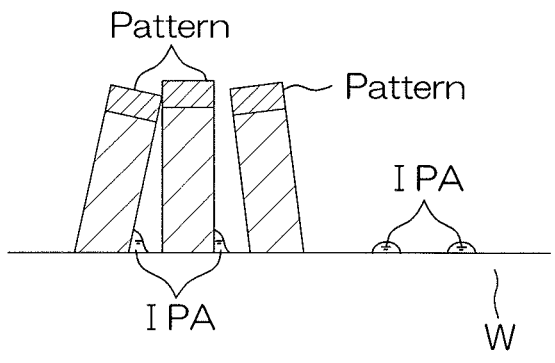
FIG. 4C is a schematic sectional view of the substrate which shows a state of the substrate when the substrate is dried without being heated after the liquid film of IPA is expelled from the upper surface of the substrate.
Figure 4D:
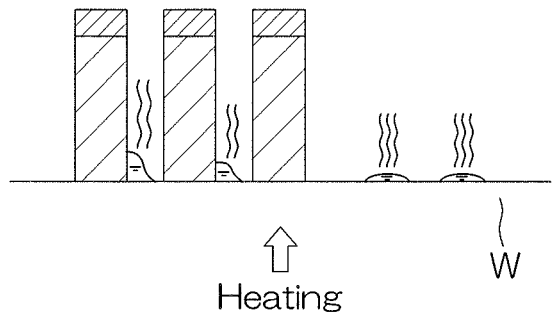
FIG. 4D is a schematic sectional view of the substrate which shows a state of the substrate when the substrate is heated after the liquid film of IPA is expelled from the upper surface of the substrate.

FIG. 4A shows a state of the substrate W before the liquid film of IPA is expelled from the upper surface of the substrate W. FIG. 4B shows a state of the substrate W after the liquid film of IPA has been expelled from the upper surface of the substrate W. FIG. 4C shows a state of the substrate W when the substrate W is dried without being heated after the liquid film of IPA has been expelled from the upper surface of the substrate W. FIG. 4D shows a state of the substrate W when the substrate W is heated after the liquid film of IPA has been expelled from the upper surface of the substrate W.

As shown in FIG. 3, in examples of processing the substrate W which will be described later (a first processing example and a second processing example), IPA is supplied to the upper surface of the substrate W to which a rinse liquid adheres, thereby forming a liquid film of IPA which covers an entire region of the upper surface of the substrate W. Thereby, the rinse liquid on the substrate W is replaced with IPA. Thereafter, the exposure hole H1 is formed at the central portion of the liquid film of IPA and the central portion of the upper surface of the substrate W is exposed from the liquid film of IPA. Then, the outer periphery H1o of the exposure hole H1 is expanded up to an outer circumference of the substrate W, and the liquid film of IPA is expelled from the upper surface of the substrate W. Thereafter, hot water is supplied to the lower surface of the substrate W to heat the substrate W.

When the outer periphery H1o of the exposure hole H1 is expanded up to the outer circumference of the substrate W and the liquid film of IPA is expelled completely from the upper surface of the substrate W, droplets of IPA which are macroscopically visible are removed from the upper surface of the substrate W. However, as shown in FIG. 4B, there is a case that small droplets of IPA which are small to such a degree that they are not visible with the naked eye may remain on the substrate W. Where patterns are formed on the front surface of the substrate W, there is a case that these droplets of IPA may remain between the root portions of the patterns. When the substrate on which the droplets of IPA remain as shown in FIG. 4B is dried over a long period of time as shown in FIG. 4C, the patterns can collapse due to the remaining droplets of IPA.

As shown in FIG. 4D, in the first processing example and the second processing example to be described hereinafter, after the liquid film of IPA has been expelled from the upper surface of the substrate W, hot water is supplied to the lower surface of the substrate W to heat the substrate W. Even when the small droplets of IPA which are small to such a degree that they are not visible with the naked eye may remain on the substrate W, these droplets of IPA will quickly evaporate upon heating of the substrate W by hot water. Thereafter, the substrate W is rotated at a high speed to dry the substrate W. It is, thereby, possible to suppress collapse of the patterns resulting from the remaining droplets of IPA.

First Processing Example

Figure 5:
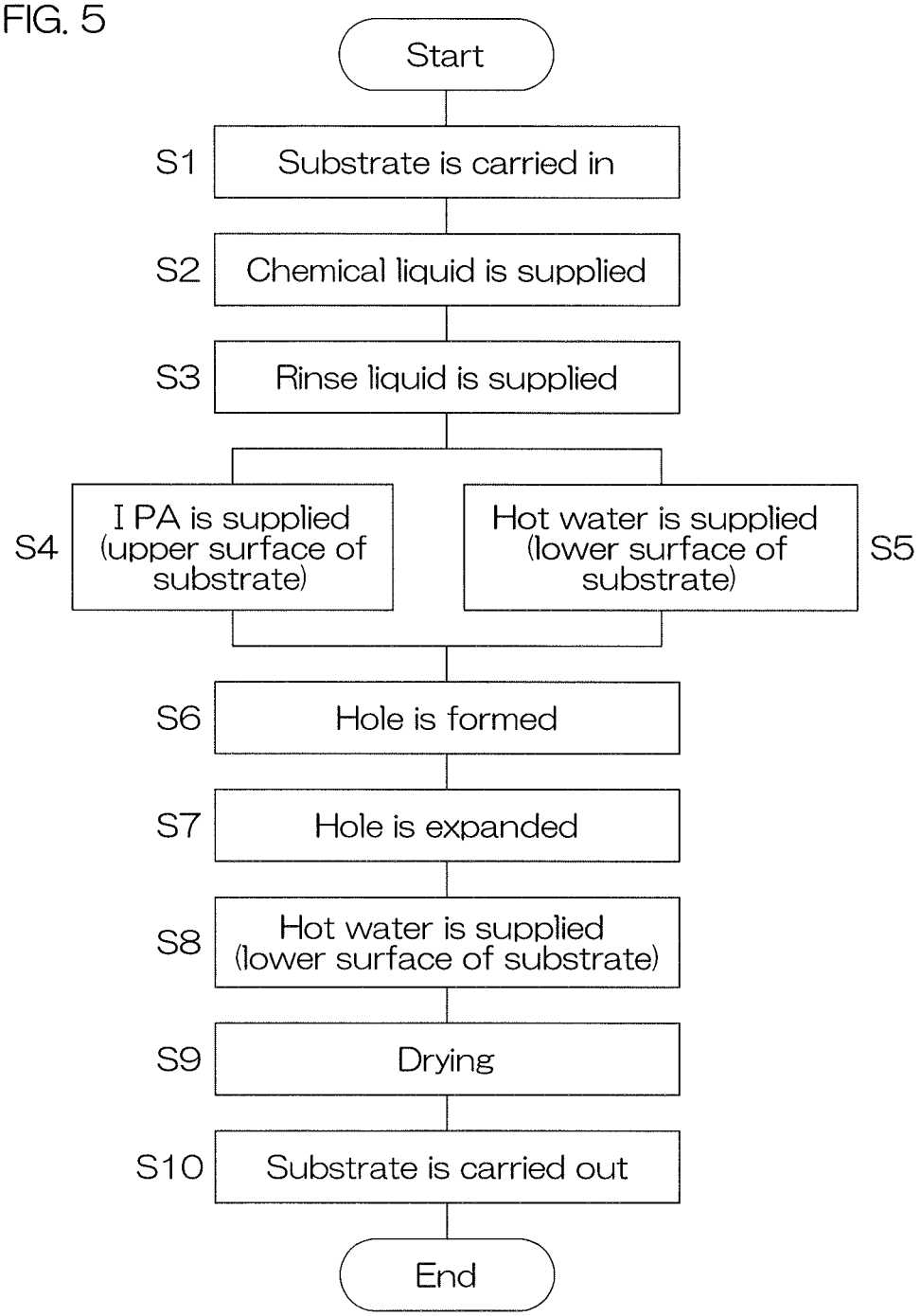
FIG. 5 is a step chart for describing one example of processing the substrate (first processing example) by the substrate processing apparatus.

FIG. 5 is a step chart for describing one example (the first processing example) of processing the substrate W by the substrate processing apparatus 1. FIG. 6 is a time chart which shows motions of the substrate processing apparatus 1 when the first processing example is performed. Each of FIG. 7A to FIG. 7H is a schematic sectional view which shows a state of the substrate processing apparatus 1 when the first processing example is performed. The following motions will be implemented by the controller 3 which controls the substrate processing apparatus 1. In other words, the controller 3 is programmed so as to implement the following motions.

When the substrate W is processed by the substrate processing apparatus 1, conducted is a carry-in step in which the substrate W is carried into the chamber 4 (Step S1 in FIG. 5).

Specifically, all the nozzles including the chemical liquid nozzle 31 are arranged at the retraction position and all guards 23 are arranged at the lower position. Further, the shielding member 13 is arranged at the upper position. In this state, a transfer robot allows a hand to advance into the chamber 4, with the substrate W being supported by the hand. Thereafter, the transfer robot places the substrate W on the hand on the spin chuck 8 in a state that the front surface of the substrate W is faced upward. The transfer robot allows the hand to retract from the interior of the chamber 4 after the substrate W has been placed on the spin chuck 8.

Next, there is conducted the chemical liquid supplying step in which the chemical liquid is supplied to the substrate W (Step S2 in FIG. 5).

Figure 7A:
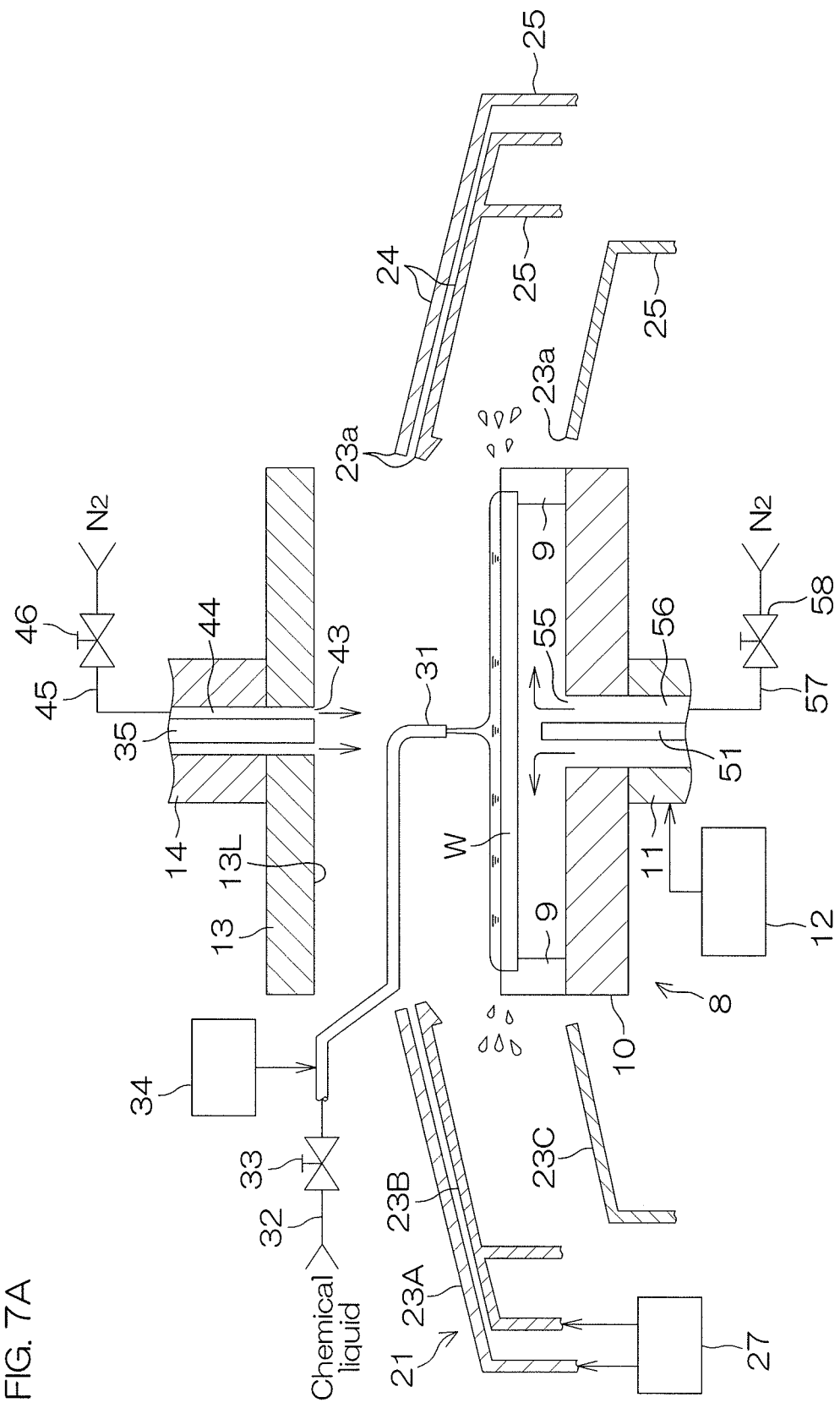
FIG. 7A is a schematic sectional view which shows a state of the substrate processing apparatus when a chemical liquid supplying step is performed.

Specifically, as shown in FIG. 7A, the upper gas valve 46 and the lower gas valve 58 are opened, and the upper central open port 43 of the shielding member 13 and the lower central open port 55 of the spin base 10 start to discharge nitrogen gas. The guard elevating/lowering unit 27 arranges the third guard 23C at the lower position and elevates the first guard 23A and the second guard 23B, thereby positioning the upper end 23a of the first guard 23A and that of the second guard 23B above from the substrate W. The nozzle movement unit 34 moves the chemical liquid nozzle 31, thereby positioning a discharge port of the chemical liquid nozzle 31 above the substrate W. The spin motor 12 starts to rotate the substrate W in a state that the substrate W is held by the chuck pin 9, thereby rotating the substrate W at a first rotation speed V1 (refer to FIG. 6).

As shown in FIG. 7A, the chemical liquid valve 33 is opened in this state, and the chemical liquid nozzle 31 starts to discharge a chemical liquid. When the chemical liquid nozzle 31 discharges the chemical liquid, the nozzle movement unit 34 may allow the chemical liquid nozzle 31 to stand still so that a position at which the chemical liquid lands is arranged on the central portion of the upper surface of the substrate W or may allow the chemical liquid nozzle 31 to move between a central processing position at which the chemical liquid discharged from the chemical liquid nozzle 31 lands on the central portion of the upper surface of the substrate W and an outer circumference processing position at which the chemical liquid discharged from the chemical liquid nozzle 31 lands on the outer circumference portion of the upper surface of the substrate W.

The chemical liquid discharged from the chemical liquid nozzle 31 lands on the upper surface of the substrate W and thereafter flows outward along the upper surface of the rotating substrate W. Thereby, a liquid film of the chemical liquid which entirely covers the upper surface of the substrate W is formed to supply the chemical liquid to an entire region of the upper surface of the substrate W. The chemical liquid expelled around the substrate W is received by the second guard 23B. After elapse of a certain period of time from opening of the chemical liquid valve 33, the chemical liquid valve 33 is closed to stop discharge of the chemical liquid from the chemical liquid nozzle 31. Thereafter, the nozzle movement unit 34 moves the chemical liquid nozzle 31 to the retraction position.

Next, there is conducted the rinse liquid supplying step in which pure water which is one example of the rinse liquid is supplied to the upper surface of the substrate W (Step S3 in FIG. 5).

Figure 7B:
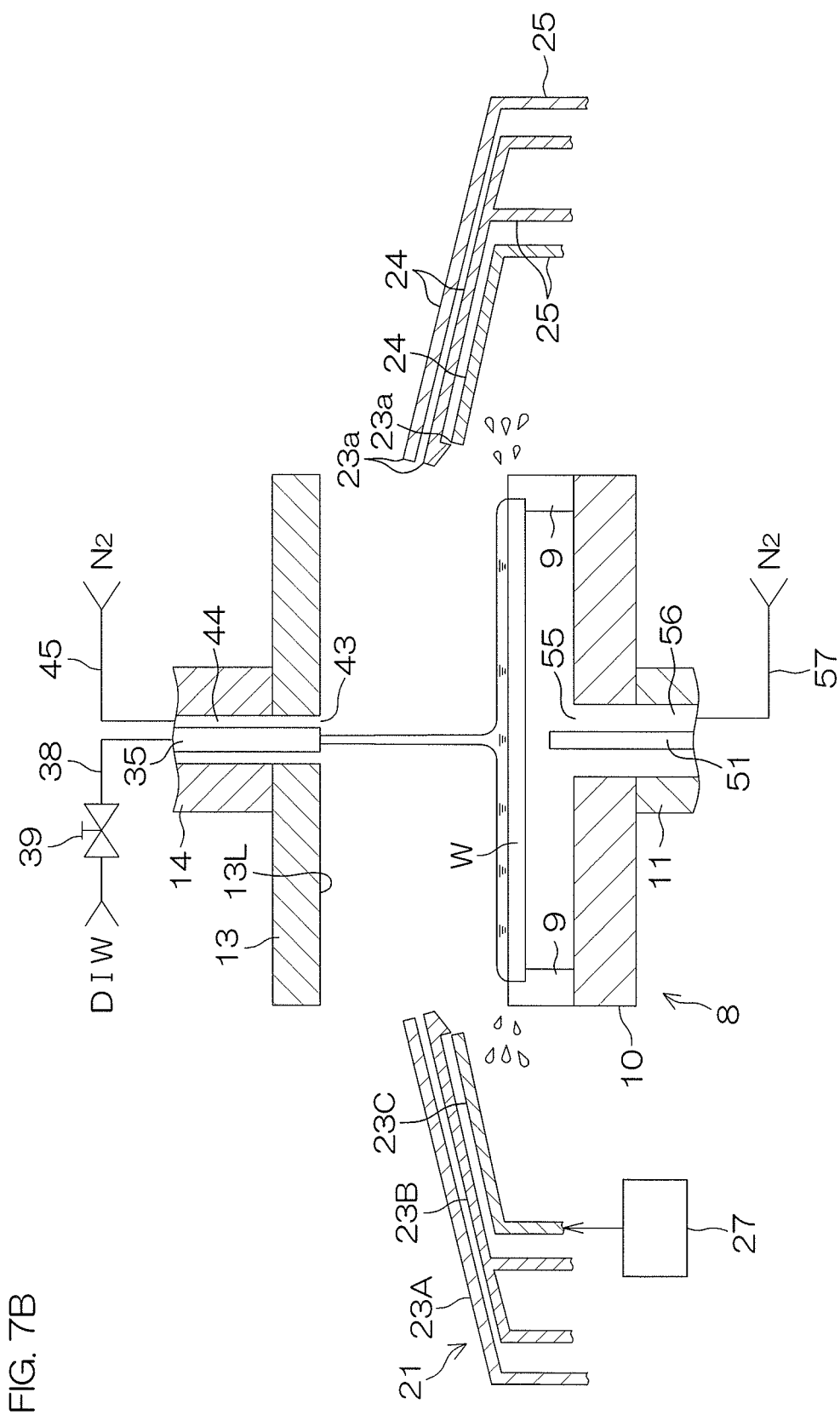
FIG. 7B is a schematic sectional view which shows a state of the substrate processing apparatus when a rinse liquid supplying step is performed.

Specifically, as shown in FIG. 7B, the guard elevating/lowering unit 27 positions the upper end 23a of the first guard 23A and that of the second guard 23B above from the substrate W to elevate the third guard 23C, thereby positioning the upper end 23a of the third guard 23C above from the substrate W. Thereafter, the rinse liquid valve 39 is opened, and the center nozzle 35 starts to discharge pure water.

The pure water discharged from the center nozzle 35 passes through the upper central open port 43 of the shielding member 13 which is positioned above and lands on the central portion of the upper surface of the substrate W. The pure water which lands on the upper surface of the substrate W flows outward along the upper surface of the rotating substrate W. The pure water expelled around the substrate W is received by the third guard 23C. The chemical liquid on the substrate W is washed away by the pure water discharged from the center nozzle 35. Thereby, the chemical liquid on the substrate W is replaced with the pure water to form a liquid film of the pure water which covers an entire region of the upper surface of the substrate W.

As shown in FIG. 7C, the shielding member elevating/lowering unit 15 lowers the shielding member 13 from the upper position to an intermediate position in a state that the center nozzle 35 discharges pure water. Thereby, a space between the upper surface of the substrate W and the lower surface 13L of the shielding member 13 is decreased in volume. Further, the lower surface 13L of the shielding member 13 is positioned below from the upper end 23a of the first guard 23A, and an open port of the first guard 23A is substantially blocked by the shielding member 13. Therefore, the substrate W is disposed inside a space which is filled with nitrogen gas and high in degree of sealing. The rinse liquid valve 39 is closed after the shielding member 13 has been lowered. Thereby, discharge of pure water from the center nozzle 35 is stopped.

Then, there is conducted the IPA supplying step in which IPA (liquid) which is one example of the low surface tension liquid lower in surface tension than the rinse liquid (pure water) is supplied to the upper surface of the substrate W (Step S4 in FIG. 5).

Specifically, as shown in FIG. 7D, in a state that the shielding member 13 is arranged at the intermediate position and the upper end 23a of the first guard 23A is positioned above from the lower surface 13L of the shielding member 13, the first solvent valve 41 is opened and the center nozzle 35 starts to discharge IPA (Time T1 in FIG. 6). IPA discharged from the center nozzle 35 passes through the upper central open port 43 of the shielding member 13 and lands on the central portion of the upper surface of the substrate W. IPA which lands on the upper surface of the substrate W flows outward along the upper surface of the rotating substrate W. Thereby, pure water on the substrate W is replaced with IPA to form a liquid film of IPA which covers an entire region of the upper surface of the substrate W.

Further, in parallel with the IPA supplying step, there is conducted the first hot water supplying step in which hot water which is one example of a heating liquid is supplied to the lower surface of the substrate W (Step S5 in FIG. 5).

Specifically, as shown in FIG. 7D, the hot water valve 53 is opened, and the lower surface nozzle 51 starts to discharge the hot water (Time T1 in FIG. 6). If the lower surface nozzle 51 discharges the hot water while the center nozzle 35 discharges IPA, discharge of the hot water may be started before or after start of discharge of IPA or it may be started at the same time with the start of discharge of IPA. FIG. 6 shows the latter case. As shown in FIG. 7D, the hot water discharged upward from the lower surface nozzle 51 lands on a central portion of the lower surface of the rotating substrate W and thereafter flows outward along the lower surface of the substrate W. Thereby, the hot water is supplied to the lower surface of the substrate W to heat the substrate W and IPA on the substrate W. The hot water discharged from the lower surface nozzle 51 is higher in temperature than IPA discharged from the center nozzle 35.

Subsequently, there is conducted the liquid film expelling step (the hole forming step and the hole expanding step) in which the exposure hole H1 is formed on a liquid film of IPA which covers the upper surface of the substrate W, and the outer periphery H1o of the exposure hole H1 is expanded up to the outer circumference of the substrate W (Step S6 and Step S7 in FIG. 5).

Specifically, when the center nozzle 35 and the lower surface nozzle 51 respectively discharge IPA and hot water, the spin motor 12 raises a rotation speed of the substrate W up to a second rotation speed V2 (Time T2 in FIG. 6).

Thereafter, the hot water valve 53 is closed to stop discharge of the hot water from the lower surface nozzle 51 (Time T3 in FIG. 6). Thereby, moisture which enters a space between the upper surface of the substrate W and the lower surface 13L of the shielding member 13 is removed or decreased in amount. In contrast, since supply of the hot water to the substrate W is stopped, the substrate W is gradually lowered in temperature at the central portion. The first solvent valve 41 is closed after the hot water valve 53 has been closed (Time T4 in FIG. 6). At this time, the central portion of the substrate W is higher in temperature than IPA before landing on the upper surface of the substrate W.

When the first solvent valve 41 is closed to stop discharge of IPA from the center nozzle 35, supply of IPA to the central portion of the upper surface of the substrate W is stopped. On the other hand, since the central portion of the substrate W is kept warm, IPA at the central portion of the upper surface of the substrate W undergoes evaporation. Further, IPA at the central portion of the upper surface of the substrate W receives a supply pressure of nitrogen gas discharged from the upper central open port 43 of the shielding member 13 and a centrifugal force resulting from rotation of the substrate W, thereby flowing outward. Therefore, when discharge of IPA is stopped, as shown in FIG. 7E, the exposure hole H1 is formed at the central portion of the liquid film of IPA which covers an entire region of the upper surface of the substrate W, and the central portion of the upper surface of the substrate W is exposed from the liquid film of IPA (Step S6 in FIG. 5). At this time, the liquid film of IPA is changed from a circular shape to an annular shape.

Figure 7F:
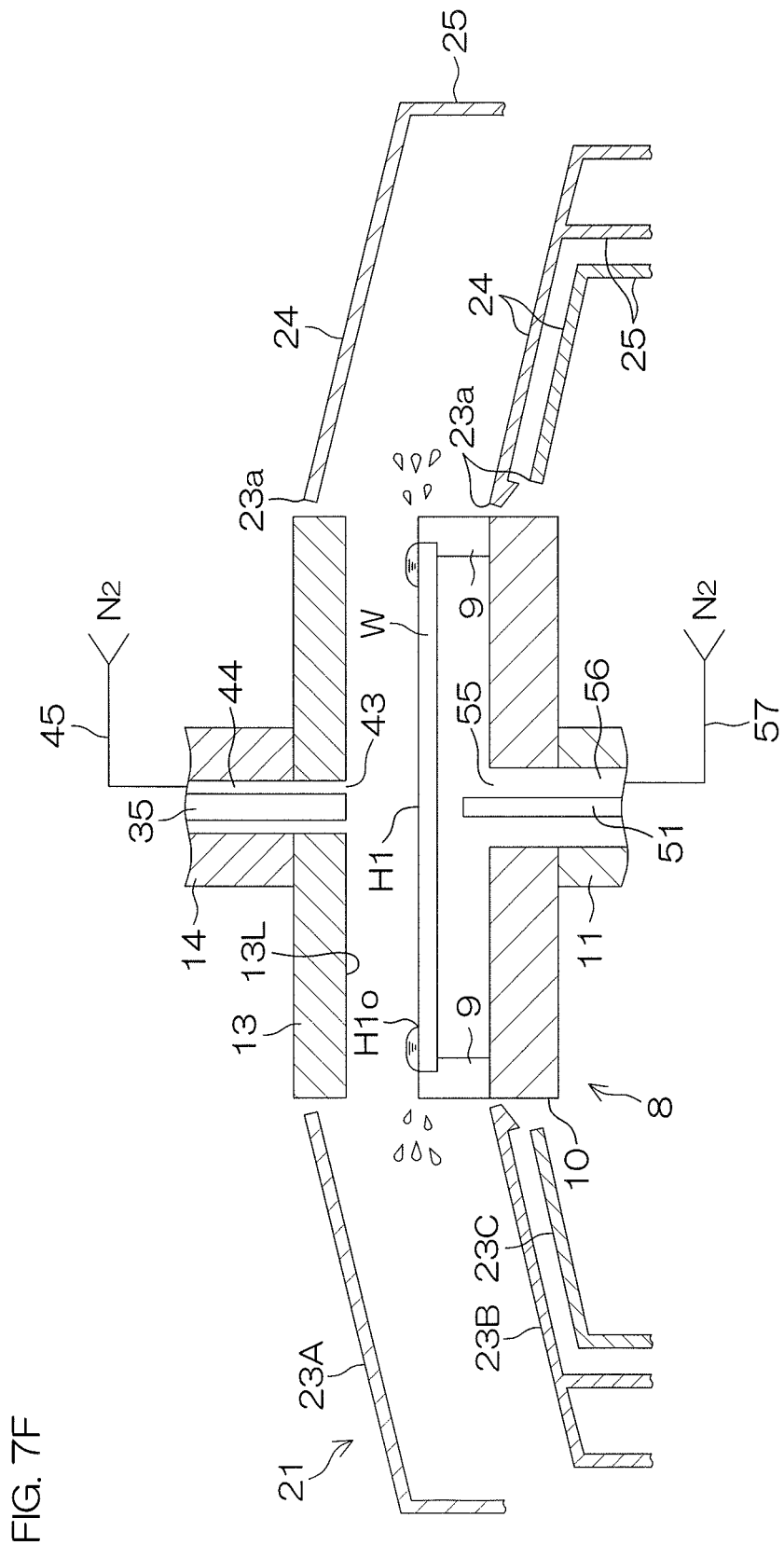
FIG. 7F is a schematic sectional view which shows a state of the substrate processing apparatus when the hole expanding step of the liquid film expelling step are performed.

As shown in FIG. 7F, the exposure hole H1 formed in the liquid film of IPA receives a supply pressure of nitrogen gas and a centrifugal force, thereby expanding from the central portion of the upper surface of the substrate W to the outer circumference of the substrate W (Step S7 in FIG. 5). In other words, the outer periphery H1o of the exposure hole H1, that is, a boundary of gas, liquid (IPA) and solid (substrate W) expands from the central portion of the upper surface of the substrate W to the outer circumference of the substrate W, and the liquid film of IPA is expelled from the upper surface of the substrate W. While the exposure hole H1 is formed and expanded up to the outer circumference of the substrate W, discharge of hot water from the lower surface nozzle 51 is stopped. Therefore, steam and mist of hot water are decreased in amount, thus making it possible to suppress or prevent them from adhering to an exposed region which is not covered by the liquid film of IPA on the upper surface of the substrate W.

Then, there is conducted the second hot water supplying step in which hot water which is one example of the heating liquid is again supplied to the lower surface of the substrate W (Step S8 in FIG. 5).

Figure 7G:
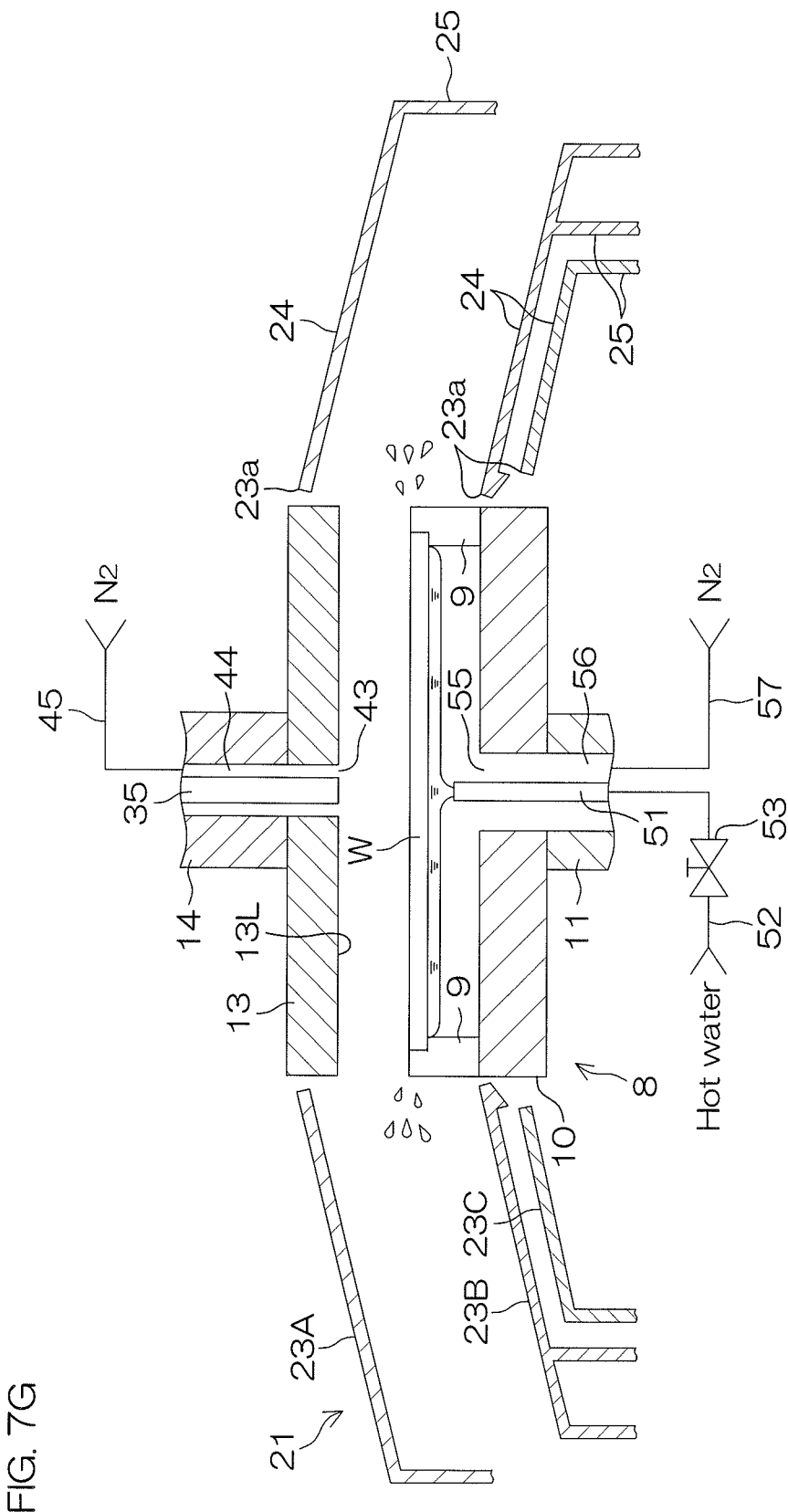
FIG. 7G is a schematic sectional view which shows a state of the substrate processing apparatus when a second hot water supplying step is performed.

Specifically, as shown in FIG. 7G, after the liquid film of IPA is expelled completely from the upper surface of the substrate W, the hot water valve 53 is opened, and discharge of hot water from the lower surface nozzle 51 is resumed (Time T5 in FIG. 6). Thereby, the substrate W is heated by the hot water. As shown in FIG. 6, at this time, the spin motor 12 rotates the substrate W at the second rotation speed V2. After elapse of a certain period of time from opening of the hot water valve 53, the hot water valve 53 is closed, and second-time discharge of hot water is stopped (Time T6 in FIG. 6).

A period of time (Time T5 to Time T6 in FIG. 6) during which the second-time discharge of hot water continues is shorter than a period of time (Time T3 to Time T4 in FIG. 6) from the time when the first-time discharge of hot water is stopped to the time when discharge of IPA is stopped and shorter than a period of time (Time T1 to Time T3 in FIG. 6) during which the first-time discharge of hot water continues. The period of time during which the second-time discharge of hot water continues may be longer than the period of time from the time when the first-time discharge of hot water is stopped to the time when discharge of IPA is stopped or may be longer than the period of time during which the first-time discharge of hot water continues.

When the second-time discharge of hot water is conducted, the liquid film of IPA is expelled completely from the substrate W and droplets of IPA which are macroscopically visible do not exist on the substrate W. However, there is a case that small droplets of IPA which are small to such a degree that they are not visible with the naked eye may remain on the substrate W. Where patterns are formed on the front surface of the substrate W, these droplets of IPA may remain between the patterns. These droplets of IPA will quickly evaporate when the substrate W is heated by hot water. Thereby, the droplets of IPA remaining on the upper surface of the substrate W can be decreased in amount to suppress collapse of the patterns by the remaining droplets of IPA.

Next, there is conducted the drying step in which the substrate W is rotated at a high speed to dry the substrate W (Step S9 in FIG. 5).

Specifically, as shown in FIG. 7H, after the second-time discharge of hot water has been stopped, the shielding member elevating/lowering unit 15 lowers the shielding member 13 from the intermediate position to the lower position, and the spin motor 12 increases a rotation speed of the substrate W to a third rotation speed V3 (Time T7 in FIG. 6). Thereby, hot water which adheres to the lower surface or the outer circumference portion of the substrate W is shaken off and removed from the substrate W. Further, even when a trace amount of IPA may remain on the substrate W, the IPA will evaporate by airflow generated by rotating the substrate W at a high speed and supply of nitrogen gas. Thereby, the liquid is removed from the substrate W to dry the substrate W. After elapse of a certain period of time from the start of rotation of the substrate W at a high speed, rotation of the spin motor 12 is stopped. Thereby, rotation of the substrate W is stopped.

Next, there is conducted a carry-out step in which the substrate W is carried out from the chamber 4 (Step S10 in FIG. 5).

Specifically, the upper gas valve 46 and the lower gas valve 58 are closed to stop discharge of nitrogen gas from the upper central open port 43 of the shielding member 13 and the lower central open port 55 of the spin base 10. The guard elevating/lowering unit 27 lowers all the guards 23 to the lower position. The shielding member elevating/lowering unit 15 elevates the shielding member 13 to the upper position. The transfer robot supports the substrate W on the spin chuck 8 by the hand after the plurality of chuck pins 9 have released the gripped substrate W. Thereafter, the transfer robot allows the hand to retract from the interior of the chamber 4, with the substrate W being supported by the hand. Thereby, the substrate W which has been processed is carried out from the chamber 4.

Second Processing Example

Figure 8:
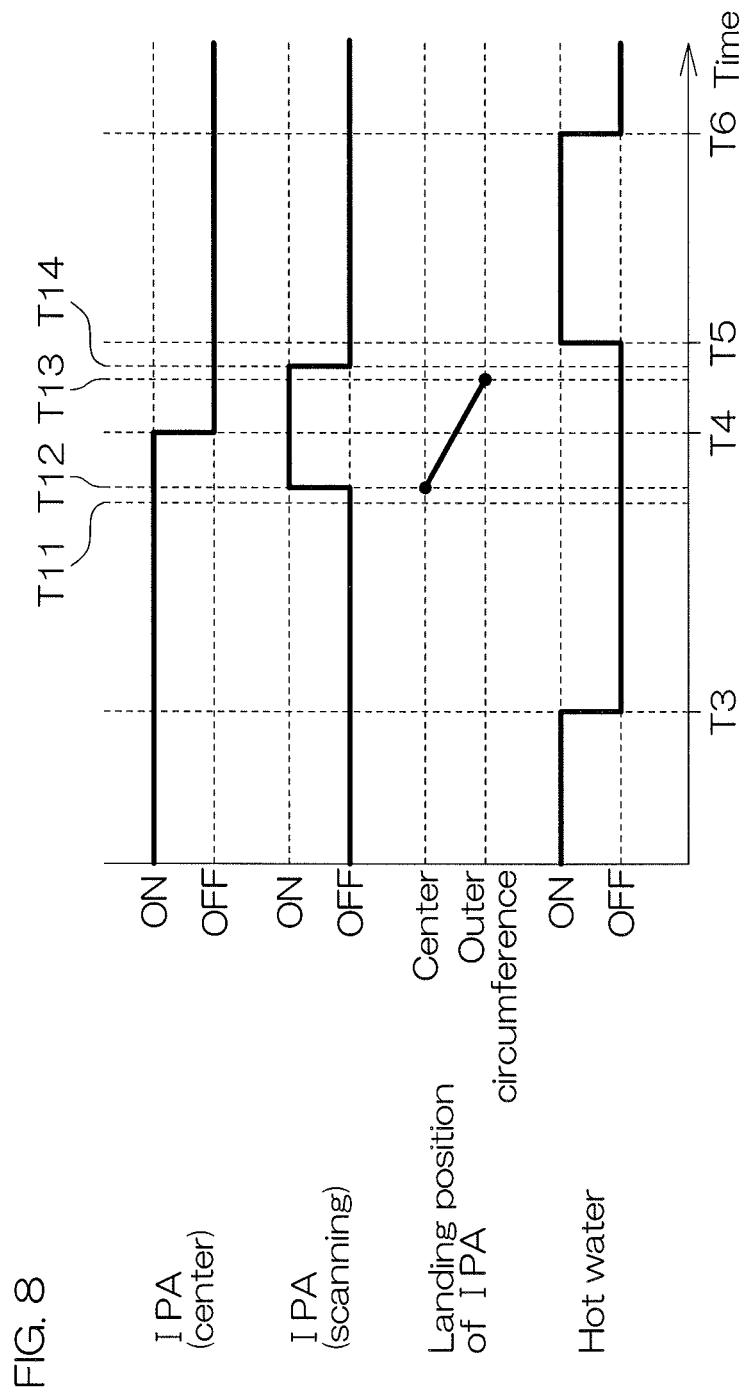
FIG. 8 is a time chart which shows motions of the substrate processing apparatus when another example of processing the substrate (second processing example) by the substrate processing apparatus is performed.
Figure 9:
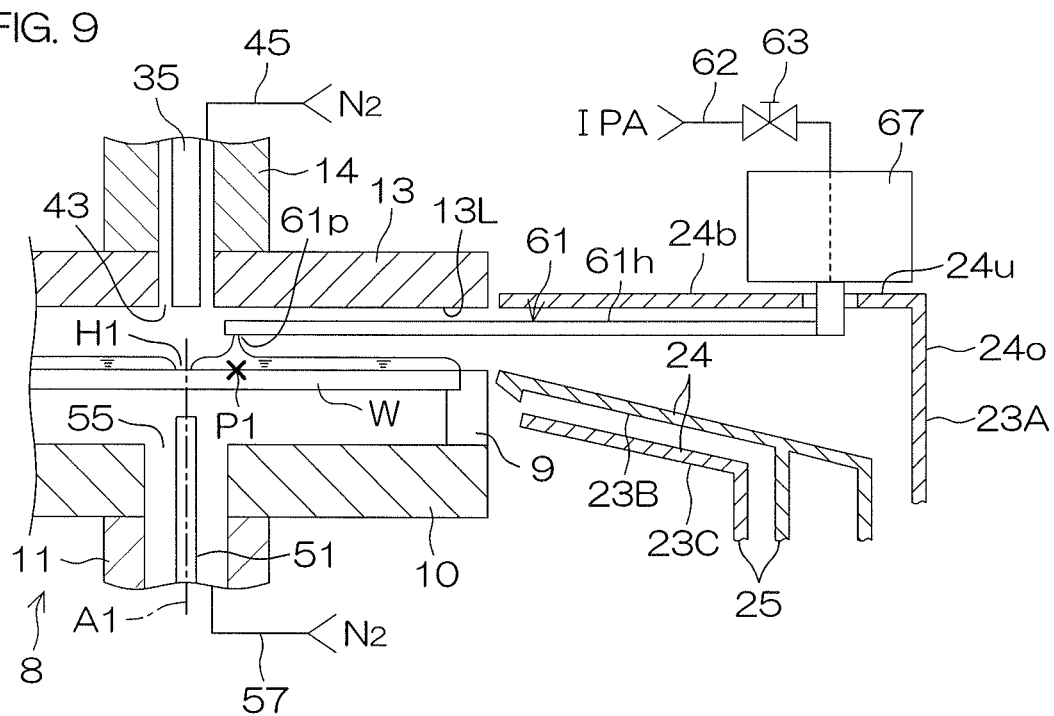
FIG. 9 is a schematic sectional view which shows a state of the substrate processing apparatus when the second processing example is performed.

FIG. 8 is a time chart which shows motions of the substrate processing apparatus 1 when another example of processing the substrate W (the second processing example) is performed by the substrate processing apparatus 1. FIG. 9 is a schematic sectional view which shows a state of the substrate processing apparatus 1 when the second processing example is performed. The following motions will be implemented by the controller 3 which controls the substrate processing apparatus 1.

In the second processing example, in parallel with the liquid film expelling step (Step S6 and Step S7 in FIG. 5), there is conducted a scanning step in which IPA is discharged to the upper surface of the substrate W, and a position of IPA which lands on the upper surface of the substrate W is moved outward. The second processing example is similar to the first processing example in other processes. Therefore, hereinafter, only matters related to the scanning step will be described.

In the scanning step, when the center nozzle 35 discharges IPA and the lower surface nozzle 51 stops discharge of hot water, the scanning unit 67 moves the second solvent nozzle 61 from the retraction position, thereby the discharge port 61p of the second solvent nozzle 61 is positioned above the central portion of the substrate W (Time T11 in FIG. 8). Thereafter, the second solvent valve 63 is opened and the second solvent nozzle 61 starts to discharge IPA (Time T12 in FIG. 8). IPA which is discharged from the second solvent nozzle 61 is lower in temperature than hot water which is discharged from the lower surface nozzle 51.

As shown in FIG. 9, IPA discharged from the second solvent nozzle 61 lands on the upper surface of the substrate W at the central position slightly away from the rotation axis A1 of the substrate W. Some of IPA which are discharged from the second solvent nozzle 61 and lands on the upper surface of the substrate W flow inward from the central position by being influenced on landing thereon and, thereafter, flow outward due to a centrifugal force. The central position is set at the center of the upper surface of the substrate W, that is, a position at which IPA that flows inward will not arrive at an intersection between the upper surface of the substrate W and the rotation axis A1.

After start of discharge of IPA from the second solvent nozzle 61, the first solvent valve 41 is closed to stop discharge of IPA from the center nozzle 35 (Time T4 in FIG. 8). As described previously, IPA discharged from the second solvent nozzle 61 does not arrive at the center of the upper surface of the substrate W. Therefore, when the first solvent valve 41 is closed, as shown in FIG. 9, supply of IPA to the central portion of the upper surface of the substrate W is stopped. The exposure hole H1 is then formed at the central portion of the liquid film of IPA which covers an entire region of the upper surface of the substrate W. Thereafter, the exposure hole H1 expands gradually by receiving a supply pressure of nitrogen gas and a centrifugal force.

The second solvent nozzle 61 discharges IPA and, therefore, when the outer periphery H1o of the exposure hole H1 reaches the vicinity of a landing position P1 of IPA discharged from the second solvent nozzle 61, expansion of the exposure hole H1 is stopped. A position of an inner peripheral edge of the liquid film of IPA is regulated by the landing position P1 of IPA discharged from the second solvent nozzle 61. The scanning unit 67 moves the discharge port 61p of the second solvent nozzle 61 outward when the second solvent nozzle 61 discharges IPA. In association therewith, the inner peripheral edge of the liquid film of IPA and the outer periphery H1o of the exposure hole H1 are moved outward.

The scanning unit 67 moves the landing position P1 of IPA discharged from the second solvent nozzle 61 from the central portion of the upper surface of the substrate W to the outer circumference portion of the upper surface of the substrate W (Time T12 to Time 13 in FIG. 8). Thereafter, the second solvent valve 63 is closed to stop discharge of IPA from the second solvent nozzle 61 (Time T14 in FIG. 8). Thereafter, the scanning unit 67 moves the second solvent nozzle 61 to the retraction position. When the second solvent valve 63 is closed, supply of IPA to the upper surface of the substrate W is stopped. Therefore, the liquid film of IPA is expelled from the upper surface of the substrate W. Thereafter, there is conducted the second hot water supplying step (Step S8 in FIG. 5).

As described above, in the present preferred embodiment, the substrate W which is held horizontally is rotated, and IPA which is one example of the low surface tension liquid is discharged to the upper surface of the substrate W. Thereby, the liquid film of IPA is formed which covers an entire region of the upper surface of the substrate W. Thereafter, the exposure hole H1 is formed at the central portion of the liquid film of IPA, and the central portion of the upper surface of the substrate W is exposed from the liquid film of IPA. Then, the outer periphery H1o of the exposure hole H1 is expanded to the outer circumference of the substrate W, and the liquid film of IPA is expelled from the upper surface of the substrate W. Thereafter, the substrate W is rotated at a high speed to dry the substrate W.

Hot water which is one example of the heating liquid is discharged to the central portion of the lower surface of the substrate W in a state that the upper surface of the substrate W is covered with the liquid film of IPA and the substrate W is rotating. After landing on the central portion of the lower surface of the substrate W, the hot water spreads outward along the lower surface of the substrate W. The substrate W and the hot water on the substrate W are heated by the hot water supplied to the lower surface of the substrate W. Thereby, the hot water will evaporate easily and the substrate W can be dried quickly.

The outer periphery H1o of the exposure hole H1 expands up to the outer circumference of the substrate W and the liquid film of IPA is expelled from the upper surface of the substrate W, by which droplets of IPA which are to such a degree that they are macroscopically visible are removed from the upper surface of the substrate W. However, there is a case that small droplets of IPA which are not visible macroscopically may remain on the substrate W. Where patterns are formed on the front surface of the substrate W, these droplets of IPA may remain between the patterns. The substrate W on which the droplets of IPA remain is dried over a long period of time, by which the patterns can collapse due to the remaining droplets of IPA.

Discharge of hot water is resumed after the outer periphery H1o of the exposure hole H1 expands up to the outer circumference of the substrate W and the liquid film of IPA is completely expelled from the upper surface of the substrate W. Thereby, the substrate W is heated by the hot water. Thereafter, the substrate W is rotated at a high speed to dry the substrate W. Even when small droplets of IPA which are small to such a degree that they are not visible with the naked eye may remain on the substrate W, these droplets of IPA will quickly evaporate due to heating of the substrate W by the hot water. It is, therefore, possible to suppress collapse of the patterns.

Further, discharge of the hot water is temporarily stopped before the exposure hole H1 is formed in the liquid film of IPA until the outer periphery H1o of the exposure hole H1 reaches the outer circumference of the substrate W. Therefore, while discharge of the hot water is stopped, the exposure hole H1 is formed at the central portion of the liquid film of IPA and the liquid film of IPA is completely expelled from the upper surface of the substrate W. That is, when a boundary between gas, liquid (IPA) and solid (substrate W) is within the upper surface of the substrate W, discharge of the hot water is stopped. Thereby, steam and mist produced from the hot water are decreased in amount, thus making it possible to suppress or prevent them from adhering to an exposed region of the upper surface of the substrate W.

When a boundary between gas, liquid and solid is present within the upper surface of the substrate W, steam and mist of another liquid adhere to an exposed region which is not covered by the liquid on the upper surface substrate W, by which particles remaining on the substrate W after being dried are increased in amount. When the upper surface of the substrate W is partially exposed from the liquid film of IPA, discharge of the hot water is stopped, thus making it possible to suppress or prevent the above-described adhesion. It is, thus, possible to decrease the particles remaining on the substrate W after being dried and also to enhance cleanliness of the substrate W.

In the present preferred embodiment, after elapse of a certain period of time from stoppage of discharge of the hot water, supply of IPA to the central portion of the upper surface of the substrate W is stopped, and the exposure hole H1 is formed at the central portion of the liquid film of IPA. When the hot water is discharged, steam and mist are produced from the hot water. The steam, etc., can enter a space above the substrate W. When discharge of the hot water is stopped, steam and mist of the hot water floating around the space above the substrate W are decreased in amount. Therefore, a period of time from the time when discharge of the hot water is stopped to the time when supply of IPA is stopped is lengthened, thus making it possible to suppress or prevent steam, etc., of the hot water from adhering to an exposed region of the upper surface of the substrate W.

When discharge of the hot water is stopped, although steam and mist of the hot water floating around the space above the substrate W are decreased in amount, a temperature of the central portion of the substrate W is lowered gradually. If a period of time from the time when discharge of the hot water is stopped to the time when supply of IPA to the central portion of the upper surface of the substrate W is stopped is excessively long, a temperature of the central portion of the substrate W is lowered down approximately to a room temperature. Where the central portion of the substrate W is lower in temperature, IPA is decreased in amount of evaporation, thereby increasing a period of time during which the exposure hole H1 is formed in the liquid film of IPA.

In the present preferred embodiment, as long as a temperature of the central portion of the substrate W is higher than a temperature of IPA before landing on the upper surface of the substrate W, a period of time from the time when discharge of the hot water is stopped to the time when supply of IPA to the central portion of the upper surface of the substrate W is stopped is extended. Thereby, it is possible to suppress or prevent steam and mist of the hot water from adhering to an exposed region within the upper surface of the substrate W, with an increased period of time during which the exposure hole H1 is formed in the liquid film of IPA being suppressed or prevented.

In the present preferred embodiment, a minimum value of rotation speed of the substrate W (rotation speed V2 shown in FIG. 6) when the second-time discharge of hot water is conducted is larger than a minimum value of rotation speed of the substrate W (rotation speed V1 shown in FIG. 6) when the first-time discharge of hot water is conducted. When the second-time discharge of hot water is conducted, a relatively small centrifugal force is applied to the hot water, although the liquid film of IPA is completely expelled from the upper surface of the substrate W. Therefore, the hot water which flows outward along the lower surface of the substrate W is less likely to flow into the upper surface of the substrate W. It is, thereby, possible to suppress or prevent steam and mist of the hot water from adhering to the upper surface of the substrate W.

In the present preferred embodiment, a period of time (Time T5 to Time T6 in FIG. 6) from the time when the second-time discharge of hot water is started to the time when the second-time discharge of hot water is stopped is shorter than a period of time (Time T1 to Time T3 in FIG. 6) from the time when the first-time discharge of hot water is started to the time when the first-time discharge of hot water is stopped. As described above, the period of time for the second-time discharge of hot water is short, by which steam and mist produced from the hot water can be decreased in amount to suppress or prevent them from adhering to the upper surface of the substrate W.

In the present preferred embodiment, the substrate W which is held horizontally is rotated and a rinse liquid is discharged to the upper surface of the substrate W, thereby forming a liquid film of the rinse liquid which covers an entire region of the upper surface of the substrate W. Thereafter, IPA is discharged to the upper surface of the substrate W covered by the liquid film of the rinse liquid. Thereby, the rinse liquid on the substrate W is replaced with IPA to form a liquid film of IPA which covers an entire region of the upper surface of the substrate W. Hot water is discharged to the lower surface of the substrate W when the rinse liquid is replaced with IPA. Thereby, the substrate W and IPA on the substrate W can be heated to promote replacement of the rinse liquid with IPA.

In the present preferred embodiment, the lower surface 13L of the shielding member 13 is disposed above the substrate W. The upper end 23a of the guard 23 which corresponds to an inner peripheral edge of the guard 23 surrounds the substrate W and the shielding member 13 in a plan view. The upper end 23a of the guard 23 is disposed at a position higher than the lower surface 13L of the shielding member 13. Therefore, a space between the upper surface of the substrate W and the lower surface 13L of the shielding member 13 is surrounded by the guard 23. It is, thereby, possible to enhance the degree of sealing of the space between the upper surface of the substrate W and the lower surface 13L of the shielding member 13 and to decrease the amount of an atmosphere which enters the space. Therefore, the substrate W can be processed inside the closed space.

In the present preferred embodiment, the IPA discharge port 61p of the second solvent nozzle 61 is disposed at the space between the upper surface of the substrate W and the lower surface 13L of the shielding member 13. The space between the upper surface of the substrate Wand the lower surface 13L of the shielding member 13 is surrounded by the guard 23. Inside the closed space, the IPA discharge port 61p is moved along the upper surface of the substrate W to expand the exposure hole H1 in the liquid film of IPA. Therefore, it is possible to control a position of the inner peripheral edge of the liquid film of IPA with a higher accuracy, with an amount of the atmosphere which enters the space between the upper surface of the substrate W and the lower surface 13L of the shielding member 13 being decreased.

Second Preferred Embodiment

Figure 10:
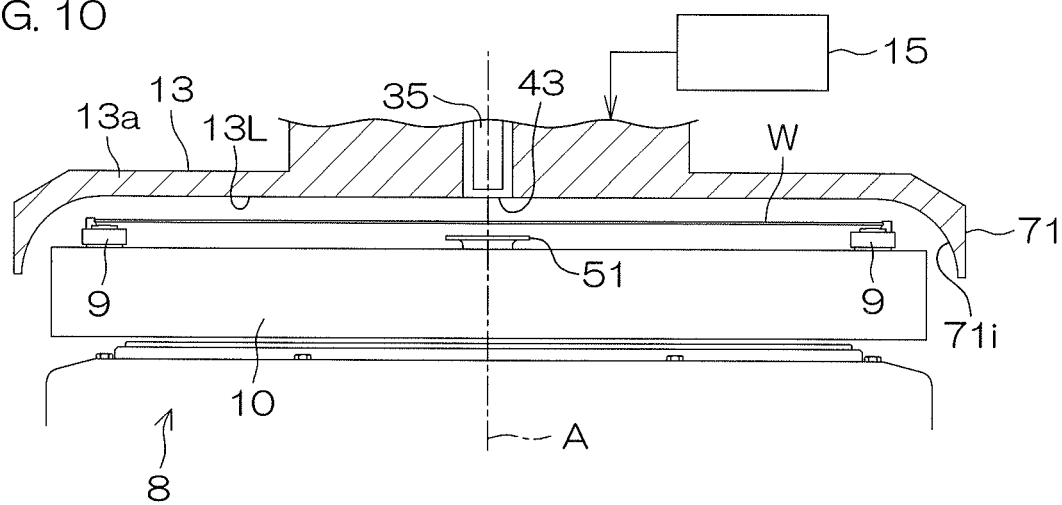
FIG. 10 is a sectional view which shows a perpendicular cross section of a shielding member according to a second preferred embodiment of the present invention.

FIG. 10 is a sectional view which shows a perpendicular cross section of a shielding member 13 according to a second preferred embodiment of the present invention. In FIG. 10, configurations similar to the configurations previously shown in FIG. 1 to FIG. 9 are given the same reference numbers as those of FIG. 1, etc., with a description thereof being omitted here.

In the second preferred embodiment, the shielding member 13 includes not only a circular plate portion 13a but also a cylindrical portion 71 which extends below from an outer circumference portion of the circular plate portion 13a.

The cylindrical portion 71 is coaxial with the circular plate portion 13a. The cylindrical portion 71 includes an inner circumferential surface 71i which extends below from a lower surface 13L of the circular plate portion 13a. The inner circumferential surface 71i of the cylindrical portion 71 includes a circular-arc shaped perpendicular cross section. The inner circumferential surface 71i of the cylindrical portion 71 may be provided with a linear perpendicular cross section which extends below from an outer circumference of the lower surface 13L of the circular plate portion 13a. The inner diameter of the circumferential surface 71i increases as it approaches the lower end of the inner circumferential surface 71i. The inner diameter of the lower end of the inner circumferential surface 71i is larger than the outer diameter of a substrate W and larger than the outer diameter of a spin base 10.

When a shielding member elevating/lowering unit 15 moves the shielding member 13 to a lower position (a position shown in FIG. 10), the lower end of the inner circumferential surface 71i of the shielding member 13 is disposed below from a lower surface of the substrate W. A space between an upper surface of the substrate W and the lower surface 13L of the circular plate portion 13a is surrounded by the cylindrical portion 71. Therefore, the space between the upper surface of the substrate W and the lower surface 13L of the circular plate portion 13a is blocked not only from an atmosphere above the shielding member 13 but also from an atmosphere around the shielding member 13. Thereby, the substrate W can be processed by controlling an atmosphere in contact with the substrate W with a high accuracy.

Third Preferred Embodiment

Figure 11:
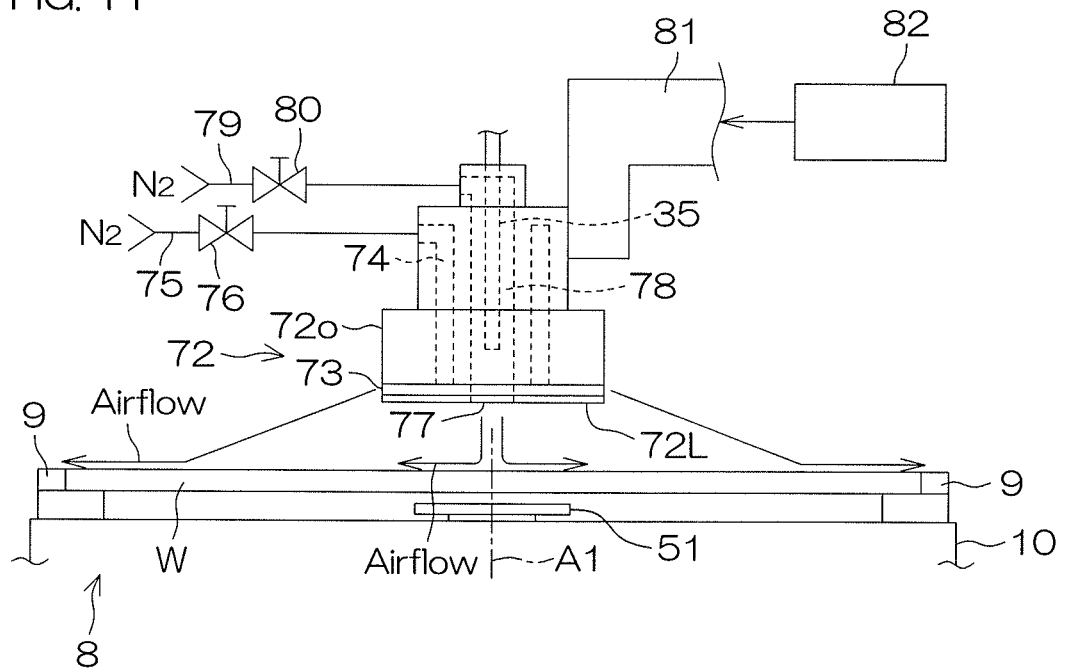
FIG. 11 is a schematic view of a gas nozzle according to a third preferred embodiment of the present invention as viewed horizontally.

FIG. 11 is a schematic view of a gas nozzle 72 according to a third preferred embodiment of the present invention as viewed horizontally. In FIG. 11, configurations similar to the configurations shown previously in FIG. 1 to FIG. 10 are given the same reference numbers as those of FIG. 1, etc., with a description thereof being omitted here.

In the third preferred embodiment, a processing unit 2 includes the gas nozzle 72 which discharges a gas above a substrate W in place of a shielding member 13.

The gas nozzle 72 is disposed above the substrate W. The gas nozzle 72 is formed in a column shape which is smaller in outer diameter than the substrate W and extends in a vertical direction. A center nozzle 35 is inserted into the gas nozzle 72. The center nozzle 35 is held by the gas nozzle 72. The center nozzle 35 moves together with the gas nozzle 72. A fluid discharged from the center nozzle 35 is supplied to an upper surface of the substrate W via a downward discharge port 77 to be described later.

The gas nozzle 72 includes a tubular outer circumferential surface 72o which surrounds a rotation axis A1 of the substrate W and a lower surface 72L which is parallel with the upper surface of the substrate W. The gas nozzle 72 includes an annular outward discharge port 73 which is opened on the outer circumferential surface 72o of the gas nozzle 72 and a downward discharge port 77 which is opened on the lower surface 72L of the gas nozzle 72. The gas nozzle 72 also includes a first flow channel 74 connected to the outward discharge port 73 and a second flow channel 78 connected to the downward discharge port 77.

The first flow channel 74 and the second flow channel 78 are provided inside the gas nozzle 72. The first flow channel 74 is formed in a tubular shape extending in a vertical direction, and the second flow channel 78 extends inside the first flow channel 74 in the vertical direction. The outward discharge port 73 is an annular silt which continues to an entire circumference of the gas nozzle 72, and the downward discharge port 77 is disposed below from the outward discharge port 73. The downward discharge port 77 faces the upper surface of the substrate W. The outward discharge port 73 is a single annular slit which surrounds a rotation axis A1. The outward discharge port 73 may include a plurality of annular slits disposed at different heights.

The gas nozzle 72 is connected to first gas piping 75 on which a first gas valve 76 is placed and to second gas piping 79 on which a second gas valve 80 is placed. When the first gas valve 76 is opened, a gas (for example, nitrogen gas) from a gas supply source is supplied via the first gas piping 75 to the first flow channel 74. Similarly, when the second gas valve 80 is opened, a gas (for example, nitrogen gas) from a gas supply source is supplied via the second gas piping 79 to the second flow channel 78.

The processing unit 2 includes a nozzle arm 81 which supports the gas nozzle 72 and a nozzle movement unit 82 which moves the gas nozzle 72 by moving the nozzle arm 81. The nozzle movement unit 82 moves the gas nozzle 72 horizontally between a processing position (a position shown in FIG. 11) at which the gas nozzle 72 overlaps the substrate W in a plan view and a retraction position at which the gas nozzle 72 is positioned around the substrate W in a plan view. The processing position is a position at which the gas nozzle 72 overlaps only a central portion of the substrate W in a plan view and the lower surface 72L of the gas nozzle 72 which corresponds to a facing surface faces an central portion of the upper surface of the substrate W in the vertical direction, with an interval kept.

When the first gas valve 76 is opened, nitrogen gas is radially discharged from the outward discharge port 73. The nitrogen gas discharged from the outward discharge port 73 assumes an annular airflow which spreads outward from the gas nozzle 72. In a state that the gas nozzle 72 is positioned at the processing position, the outward discharge port 73 discharges the nitrogen gas, by which the discharged nitrogen gas flows outward along the upper surface of the substrate W and passes above an outer circumference portion of the upper surface of the substrate W. Thereby, the upper surface of the substrate W is covered entirely by the airflow, and the upper surface of the substrate W is protected from foreign matter such as mist and particles of a processing liquid.

When the second gas valve 80 is opened, nitrogen gas is discharged downward from the downward discharge port 77. In a state that the gas nozzle 72 is positioned at the processing position, the downward discharge port 77 discharges the nitrogen gas, by which the nitrogen gas discharged from the downward discharge port 77 collides with the upper surface of the substrate W and thereafter radially spreads between the upper surface of the substrate W and the lower surface 72L of the gas nozzle 72. The nitrogen gas which has passed through a space between the lower surface 72L of the gas nozzle 72 and the upper surface of the substrate W flows outward along the upper surface of the substrate W and passes above the outer circumference portion of the upper surface of the substrate W. Therefore, in a state that the gas nozzle 72 is arranged at the processing position, both the outward discharge port 73 and the downward discharge port 77 discharge nitrogen gas, by which the upper surface of the substrate W is entirely protected by a plurality of airflow layers which are overlapped vertically.

Other Preferred Embodiments

The present invention shall not be limited to contents of the previously described preferred embodiments but can be modified in various ways.

For example, at least one of IPA and pure water may be discharged from a nozzle other than a center nozzle 35. For example, at least one of IPA and pure water may be discharged from a scanning nozzle similar to a chemical liquid nozzle 31.

When an exposure hole H1 formed on a liquid film of IPA is expanded and if a landing position of IPA does not need to be moved, with IPA being discharged to an upper surface of a substrate W, a scanning second solvent nozzle 61 may be omitted.

At least one of a first solvent heater 42 and a second solvent heater 64 may be omitted or both of the first solvent heater 42 and the second solvent heater 64 may be omitted. In this case, IPA at a room temperature is to be supplied to the upper surface of the substrate W from one of a first solvent nozzle (a second tube 37B of a center nozzle 35) and the second solvent nozzle 61 or from both of them.

In an IPA supplying step (Step S4 in FIG. 5), a rinse liquid (pure water) on the substrate W may be replaced not with IPA discharged from a first solvent nozzle (a second tube 37B of the center nozzle 35) but with IPA discharged from the second solvent nozzle 61. In this case, the second solvent nozzle 61 may be moved to a position at which IPA discharged from the second solvent nozzle 61 lands on a central portion of the upper surface of the substrate W.

In the IPA supplying step (Step S4 in FIG. 5), a temperature of the central portion of the substrate W when discharge of IPA is stopped may be equal to or lower than a temperature of IPA before landing on the upper surface of the substrate W.

A minimum value of rotation speed of the substrate W when a second hot water supplying step (Step S8 in FIG. 5) is conducted may be equal to or lower than a minimum value of rotation speed of the substrate W when a first hot water supplying step (Step S5 in FIG. 5) is conducted. The substrate W may be rotated, for example, in a second rotation speed V2 before the start of the first hot water supplying step.

In the first processing example, at least one of upper ends 23a of a first guard 23A to a third guard 23C is disposed above from a lower surface 13L (facing surface) of a shielding member 13. However, the lower surface 13L of the shielding member 13 may be constantly positioned above from the upper end 23a of the first guard 23A.

A heating liquid may be a liquid other than hot water as long as a temperature thereof is higher than a room temperature. For example, any one of electrolysis ionized water, hydrogen water, ozone-treated water and hydrochloric acid water with a diluted concentration (for example, about 10 to 100 ppm) may be the heating liquid.

A flow rate of the heating liquid supplied to the lower surface of the substrate W by the first hot water supplying step (Step S5 in FIG. 5) of the first processing example may be equal to or different from a flow rate of the heating liquid supplied to the lower surface of the substrate W in the second hot water supplying step (Step S8 in FIG. 5). For example, the former may exceed the latter or the latter may exceed the former.

The heating liquid may land on a position inside the lower surface of the substrate W excluding the rotation center in both or one of the first and the second hot water supplying steps (Step S5 and S8 in FIG. 5) of the first processing example.

A flow rate of an inert gas discharged from an upper gas flow channel 44 in a hole forming step (Time T4 in FIG. 6) and a hole expanding step (a period of time from Time T4 to Time T5 in FIG. 6) of the first processing example may be greater than a flow rate of an inert gas at other times (for example, before Time T1, a period of time from Time T1 to time before Time T4 and a period of time after Time T5). Thereby, it is possible to decrease an amount of mist and steam of hot water which flows into the upper surface of the substrate W from the lower surface of the substrate W in the hole forming step and the hole expanding step.

The substrate processing apparatus 1 is not restricted to an apparatus that processes a disk-shaped substrate W and may be an apparatus that processes a polygonal substrate W.

Two or more of any of the arrangements described above may be combined. Two or more of any of the steps described above may be combined.

The present application corresponds to Japanese Patent Application No. 2017-061826 filed in the Japan Patent Office on Mar. 27, 2017, and the entire disclosure of this application is incorporated herein by reference.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A substrate processing method comprising:
a low surface tension liquid supplying step of replacing a rinse liquid on a substrate with a low surface tension liquid lower in surface tension than the rinse liquid and forming a liquid film of the low surface tension liquid covering an upper surface of the substrate by supplying the low surface tension liquid to the upper surface of the substrate to which the rinse liquid is adhering and which is held horizontally while rotating the substrate about a vertical rotation axis passing through a central portion of the substrate;
a hole forming step of forming, after the low surface tension liquid supplying step is started, a hole at a central portion of the liquid film of the low surface tension liquid and exposing a central portion of the upper surface of the substrate from the liquid film of the low surface tension liquid by stopping supply of the low surface tension liquid to the central portion of the upper surface of the substrate while rotating the substrate around the rotation axis;
a hole expanding step of removing the liquid film of the low surface tension liquid from the upper surface of the substrate by expanding the hole to an outer circumference of the substrate while rotating the substrate around the rotation axis after the hole forming step;

a drying step of shaking off a liquid adhering to the substrate and drying the substrate by rotating the substrate around the rotation axis after the hole expanding step;

a first heating liquid supplying step of supplying a heating liquid having a temperature higher than a room temperature to a lower surface of the substrate in parallel with at least a portion of the low surface tension liquid supplying step and thereafter stopping supply of the heating liquid to the lower surface of the substrate before the hole forming step is started; and a second heating liquid supplying step of supplying, after the hole expanding step is ended, the heating liquid to the lower surface of the substrate while rotating the substrate around the rotation axis and thereafter stopping supply of the heating liquid to the lower surface of the substrate before the drying step is started; wherein a rotation speed of the substrate in the drying step is larger than a rotation speed of the substrate in the hole expanding step.

2. The substrate processing method according to claim 1, wherein a period of time from the time when the first heating liquid supplying step is ended to the time when supply of the low surface tension liquid to the central portion of the upper surface of the substrate is stopped in the hole forming step is longer than a period of time from the time when supply of the heating liquid is started in the second heating liquid supplying step to the time when supply of the heating liquid is stopped in the second heating liquid supplying step.

3. The substrate processing method according to claim 2, wherein the hole forming step is a step of stopping, after the low surface tension liquid supplying step is started, supply of the low surface tension liquid to the central portion of the upper surface of the substrate in a state in which a temperature of the central portion of the substrate is higher than a temperature of the low surface tension liquid to be supplied to the upper surface of the substrate.

4. The substrate processing method according to claim 1, wherein a minimum value of a rotation speed of the substrate in the second heating liquid supplying step is larger than a minimum value of a rotation speed of the substrate in the first heating liquid supplying step.

5. The substrate processing method according to claim 1, wherein a period of time during which the heating liquid is supplied in the second heating liquid supplying step is shorter than a period of time during which the heating liquid is supplied in the first heating liquid supplying step.

6. The substrate processing method according to claim 1, further comprising:

a closed-space forming step of locating an upper end of a tubular guard, which surrounds the substrate and a shielding member in a plan view, at a position higher than a facing surface of the shielding member disposed above the substrate while causing the facing surface of the shielding member to face the upper surface of the substrate in parallel with the hole expanding step.

7. The substrate processing method according to claim 6, wherein the low surface tension liquid supplying step includes a scanning step of causing a landing position of the low surface tension liquid with respect to the upper surface of the substrate to move outward by moving a low surface tension liquid supplying port, which supplies the low surface tension liquid, between the facing surface of the shielding member and the upper surface of the substrate in parallel with the hole expanding step.

8. The substrate processing method according to claim 1, wherein the drying step includes a step of raising a rotation speed of the substrate after the hole has expanded to the outer circumference of the substrate and the liquid film of the low surface tension liquid has been removed from the upper surface of the substrate.

9. A substrate processing apparatus comprising:

a substrate holding unit which rotates a substrate around a vertical rotation axis passing through a central portion of the substrate while holding the substrate horizontally to which a rinse liquid adhering;

a low surface tension liquid nozzle which discharges a low surface tension liquid lower in surface tension than the rinse liquid to an upper surface of the substrate held by the substrate holding unit;

a lower surface nozzle which discharges a heating liquid having a higher temperature than a room temperature to a lower surface of the substrate held by the substrate holding unit; and a controller which conducts the substrate processing method according to claim 1, wherein the controller comprises a computer including a memory that stores information and a processor that controls the substrate processing apparatus according to the information stored in the memory.

* * * * *